US011233118B2

(12) United States Patent
Park et al.

(10) Patent No.: US 11,233,118 B2
(45) Date of Patent: Jan. 25, 2022

(54) INTEGRATED CIRCUIT DEVICE HAVING DIELECTRIC LAYER, AND METHOD AND APPARATUS FOR MANUFACTURING THE INTEGRATED CIRCUIT DEVICE

(71) Applicant: SAMSUNG ELECTRONICS CO., LTD., Suwon-si (KR)

(72) Inventors: Young-Lim Park, Anyang-si (KR); Sun-Min Moon, Yongin-si (KR); Chang-Hwa Jung, Seoul (KR); Young-Geun Park, Suwon-si (KR); Jong-Bom Seo, Seoul (KR); Kyu-Ho Cho, Seoul (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 160 days.

(21) Appl. No.: 16/400,475

(22) Filed: May 1, 2019

(65) Prior Publication Data
US 2019/0355804 A1 Nov. 21, 2019

(30) Foreign Application Priority Data
May 18, 2018 (KR) .................. 10-2018-0057433

(51) Int. Cl.
H01L 49/02 (2006.01)
C23C 16/455 (2006.01)

(52) U.S. Cl.
CPC ........ *H01L 28/75* (2013.01); *C23C 16/45536* (2013.01)

(58) Field of Classification Search
CPC combination set(s) only.
See application file for complete search history.

(56) References Cited

U.S. PATENT DOCUMENTS

| 7,208,198 | B2 | 4/2007 | Basceri et al. |
| 7,842,581 | B2 | 11/2010 | Chung et al. |
| 8,273,408 | B2 | 9/2012 | Kim et al. |
| 8,318,572 | B1 | 11/2012 | Shanker et al. |
| 8,813,325 | B2 | 8/2014 | Ramani et al. |
| 9,171,960 | B2 | 10/2015 | Hong et al. |
| 9,431,474 | B2* | 8/2016 | Popovici ............ H01G 4/008 |

(Continued)

FOREIGN PATENT DOCUMENTS

| JP | 4937771 | 5/2012 |
| KR | 10-0673203 | 1/2007 |

(Continued)

OTHER PUBLICATIONS

S. Toyoda, et al., "Determining Factor of Effective Work Function in Metal/Bi-Layer High-K Gate Stack Structure Studied by Photoemission Spectroscopy", Applied Physics Letters 100, 112906 (2012).

(Continued)

*Primary Examiner* — Mark W Tornow
*Assistant Examiner* — Priya M Rampersaud
(74) *Attorney, Agent, or Firm* — F. Chau & Associates, LLC

(57) ABSTRACT

An integrated circuit (IC) device includes an electrode, a dielectric layer facing the electrode, and a plurality of interface layers interposed between the electrode and the dielectric layer and including a first metal. The plurality of interface layers includes a first interface layer and a second interface layer. An oxygen content of the first interface layer is different from an oxygen content of the second interface layer.

20 Claims, 25 Drawing Sheets

(56) References Cited

U.S. PATENT DOCUMENTS

| | | | |
|---|---|---|---|
| 9,564,310 B1* | 2/2017 | Adusumilli | H01L 21/02183 |
| 9,691,839 B2 | 6/2017 | Lindert et al. | |
| 2007/0090461 A1* | 4/2007 | Eliason | H01L 27/11507 |
| | | | 257/363 |
| 2012/0270727 A1 | 10/2012 | Yabuuchi | |
| 2015/0087130 A1* | 3/2015 | Chen | H01L 28/40 |
| | | | 438/396 |
| 2015/0228710 A1* | 8/2015 | Rui | H01L 28/40 |
| | | | 438/396 |
| 2016/0099304 A1* | 4/2016 | Mathur | H01L 27/10805 |
| | | | 257/532 |
| 2016/0133691 A1* | 5/2016 | Phatak | H01L 28/75 |
| | | | 257/532 |
| 2019/0096985 A1* | 3/2019 | Tu | H01L 27/1116 |

FOREIGN PATENT DOCUMENTS

| | | |
|---|---|---|
| KR | 10-0732748 | 6/2007 |
| KR | 1020090022801 | 3/2009 |
| KR | 10-0906616 | 7/2009 |
| KR | 10-1013818 | 2/2011 |

OTHER PUBLICATIONS

"Hydrogen Safety", EH&S Fact Sheet (Environment, Health and Safety Information for the Berkeley Campus) No. 80, Created Feb. 4, 2013.

* cited by examiner

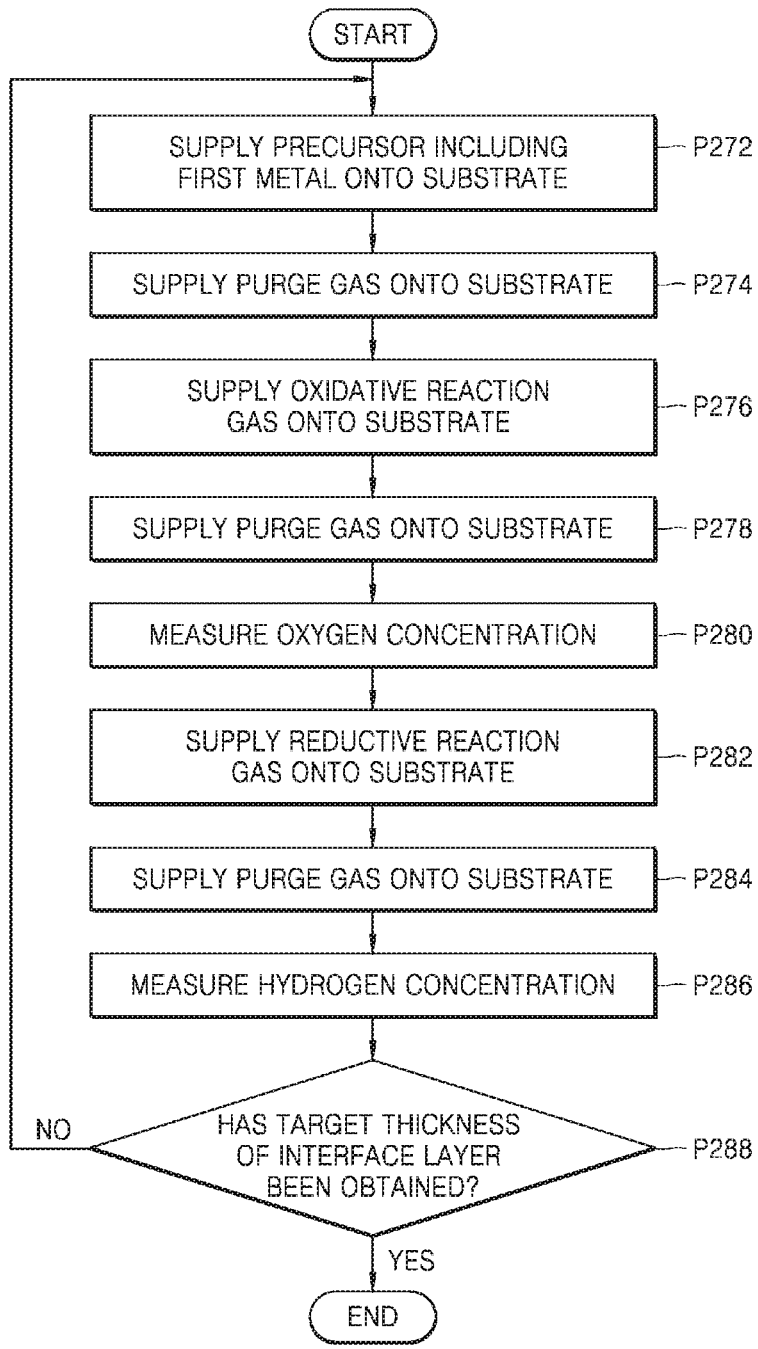

INTEGRATED CIRCUIT DEVICE HAVING DIELECTRIC LAYER, AND METHOD AND APPARATUS FOR MANUFACTURING THE INTEGRATED CIRCUIT DEVICE

CROSS-REFERENCE TO RELATED PATENT APPLICATIONS

This application claims priority under 35 U.S.C. § 119 to Korean Patent Application No. 10-2018-0057433, filed on May 18, 2018 in the Korean Intellectual Property Office, the disclosure of which is incorporated by reference herein in its entirety.

TECHNICAL FIELD

Exemplary embodiments of the present inventive concept relate to an integrated circuit (IC) device and a method and apparatus for manufacturing the same, and more particularly, to an IC device having a dielectric layer and a method and apparatus for manufacturing the IC device.

DISCUSSION OF THE RELATED ART

As technology advances, semiconductor devices are rapidly being down-scaled, and as a result, patterns that constitute an electronic device are being increasingly miniaturized. Even when a dielectric layer having a relatively small thickness is formed in a capacitor having a miniaturized size, a structure capable of reducing a leakage current in the capacitor and maintaining desired electrical characteristics is needed.

SUMMARY

Exemplary embodiments of the inventive concept provide an integrated circuit (IC) device capable of reducing a leakage current in a capacitor and maintaining desired electrical characteristics.

Exemplary embodiments of the inventive concept provide a method and apparatus for manufacturing an IC device capable of reducing a leakage current in a capacitor and maintaining desired electrical characteristics.

According to an exemplary embodiment of the inventive concept, an IC device includes, an electrode, a dielectric layer facing the electrode, and a plurality of interface layers interposed between the electrode and the dielectric layer and including a first metal. The plurality of interface layers includes a first interface layer and a second interface layer. An oxygen content of the first interface layer is different from an oxygen content of the second interface layer.

According to an exemplary embodiment of the inventive concept, an IC device includes a lower electrode and an upper electrode facing each other, a dielectric layer interposed between the lower electrode and the upper electrode, a lower interface layer interposed between the lower electrode and the dielectric layer and including a first metal, and an upper interface layer interposed between the dielectric layer and the upper electrode and including the first metal. Each of the lower interface layer and the upper interface layer includes a plurality of interface layers having different oxygen contents.

According to an exemplary embodiment of the inventive concept, an IC device includes a dielectric layer formed on a substrate, a plurality of interface layers formed on the dielectric layer and including a first interface layer and a second interface layer having different oxygen contents, and an electrode formed on the plurality of interface layers.

According to an exemplary embodiment of the inventive concept, a method of manufacturing an IC device includes forming a plurality of interface layers having different oxygen contents consecutively on a substrate by using a precursor including a first metal, an oxidative reaction gas, and a reductive reaction gas within a reaction space.

According to an exemplary embodiment of the inventive concept, a method of manufacturing an IC device includes forming a first interface layer including a first metal on a substrate within a reaction space, and forming a second interface layer having an oxygen content different from an oxygen content of the first interface layer on the first interface layer, in-situ with forming the first interface layer within the reaction space. At least one of forming the first interface layer and forming the second interface layer includes supplying a precursor including the first metal onto the substrate, supplying an oxidative reaction gas onto the substrate, measuring an oxygen concentration within the reaction space or an oxygen concentration within a vent pipe connected to the reaction space after supplying the oxidative reaction gas onto the substrate, supplying a reductive reaction gas onto the substrate, and measuring a hydrogen concentration within the reaction space or a hydrogen concentration within the vent pipe connected to the reaction space after supplying the reductive reaction gas onto the substrate.

According to an exemplary embodiment of the inventive concept, an IC device manufacturing apparatus for manufacturing the above-described IC devices includes a chamber configured to provide the reaction space, at least one vent pipe connected to the chamber and configured to exhaust a gas within the chamber to outside of the chamber, an optical viewport formed in a sidewall of the chamber, and at least one gas concentration measuring device configured to detect an oxygen concentration and a hydrogen concentration from at least one location selected from the at least one vent pipe and the inside of the chamber.

BRIEF DESCRIPTION OF THE DRAWINGS

The above and other features of the present inventive concept will become more apparent by describing in detail exemplary embodiments thereof with reference to the accompanying drawings, in which:

FIG. 11 is a flowchart of an exemplary method of forming an interface layer according to exemplary embodiments of the inventive concept.

DETAILED DESCRIPTION OF THE EXEMPLARY EMBODIMENTS

Figure 1:
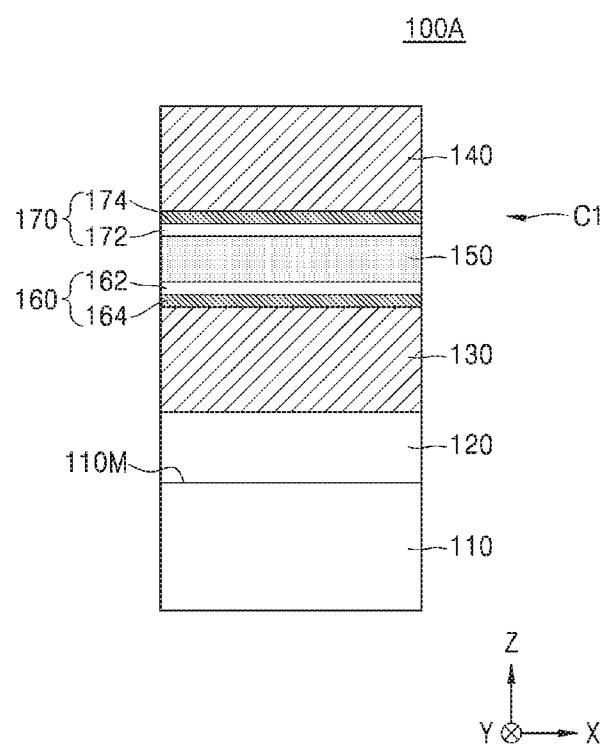
FIG. 1 is a cross-sectional view illustrating components of an integrated circuit (IC) device according to exemplary embodiments of the inventive concept.

Exemplary embodiments of the inventive concept will be described more fully hereinafter with reference to the accompanying drawings. Like reference numerals may refer to like elements throughout the accompanying drawings, and thus, a repeated description of such elements will be omitted.

Herein, when two components or directions are described as extending substantially parallel or perpendicular to each other, the two components or directions extend exactly parallel or perpendicular to each other, or extend approximately parallel or perpendicular to each other within a measurement error as would be understood by a person having ordinary skill in the art.

FIG. 1 is a cross-sectional view illustrating components of an integrated circuit (IC) device 100A according to exemplary embodiments of the inventive concept.

Referring to FIG. 1, the IC device 100A includes a substrate 110, a lower structure 120 formed on the substrate 110, and a capacitor C1 formed on the lower structure 120. The capacitor C1 may include a portion extending substantially parallel to a direction in which a main surface 110M of the substrate 110 extends (X-Y plane direction).

The substrate 110 may include a semiconductor element such as, for example, Si or Ge, or a compound semiconductor such as, for example, SiC, GaAs, InAs, or InP. The substrate 110 may include a semiconductor substrate, at least one insulation layer formed on the semiconductor substrate, or structures including at least one conductive region. The conductive region may include, for example, an impurity-doped well or an impurity-doped structure. According to exemplary embodiments, the substrate 110 may have any of various isolation structures such as, for example, a shallow trench isolation (STI) structure.

The lower structure 120 may include an insulating layer. Alternatively, the lower structure 120 may include various conductive regions such as, for example, a wiring layer, a contact plug, and a transistor, and an insulating layer that connects such structures to each other.

The capacitor C1 may include a lower electrode 130 and an upper electrode 140 disposed opposite to each other, and a dielectric layer 150 interposed between the lower electrode 130 and the upper electrode 140.

A lower interface layer 160 including a first metal may be interposed between the lower electrode 130 and the dielectric layer 150, and an upper interface layer 170 including the first metal may be interposed between the dielectric layer 150 and the upper electrode 140. According to exemplary embodiments, the first metal may be selected from, for example, Mo, Nb, Sn, Ta, Ti, In, Ni, Co, W, and Ru, however, exemplary embodiments are not limited thereto. Each of the lower interface layer 160 and the upper interface layer 170 may include a portion extending substantially parallel to the direction in which the main surface 110M of the substrate 110 extends (X-Y plane direction).

The lower interface layer 160 may include a first interface layer 162 and a second interface layer 164 having different oxygen contents. For example, in an exemplary embodiment, the first interface layer 162 has a first oxygen content (e.g., a first amount of oxygen included therein) and the second interface layer 164 has a second oxygen content (e.g., a second amount of oxygen included therein) that is different from the first oxygen content of the first interface layer 162. The upper interface layer 170 may include a first interface layer 172 and a second interface layer 174 having different oxygen contents. For example, in an exemplary embodiment, the first interface layer 172 has a first oxygen content (e.g., a first amount of oxygen included therein) and the second interface layer 174 has a second oxygen content (e.g., a second amount of oxygen included therein) that is different from the first oxygen content of the first interface layer 172. Each of the first interface layer 162 and the first interface layer 172 may constitute an inner interface layer that contacts (e.g., directly contacts) the dielectric layer 150. Each of the second interface layer 164 and the second interface layer 174 may constitute an outer interface layer that is spaced apart from the dielectric layer 150 (e.g., that does not contact the dielectric layer 150). For example, the second interface layer 164 may be spaced apart from the dielectric layer 150 with the first interface layer 162 interposed therebetween, and the second interface layer 174 may be spaced apart from the dielectric layer 150 with the first interface layer 172 interposed therebetween.

The first interface layer 162 and the second interface layer 164 that constitute the lower interface layer 160, and the first interface layer 172 and the second interface layer 174 that constitute the upper interface layer 170, may each include an oxide of the first metal. However, an oxygen content of each of the first interface layer 162 and the first interface layer 172 may be greater than that of each of the second interface layer 164 and the second interface layer 174. For example, in an exemplary embodiment, the oxygen content of the first interface layer 162 (e.g., the amount of oxygen included in the first interface layer 162) is greater than the oxygen content of the second interface layer 164 (e.g., the amount of oxygen included in the second interface layer 164). In an exemplary embodiment, the oxygen content of the first interface layer 172 (e.g., the amount of oxygen included in the first interface layer 172) is greater than the oxygen content of the second interface layer 174 (e.g., the amount of oxygen included in the second interface layer 174).

According to exemplary embodiments, each of the first interface layer 162 and the first interface layer 172 that constitute the inner interface layer may include an oxide $M_xO_y$ (where M is the first metal, x is equal to 1 or 2, O is oxygen, y is an integer, and $1 \leq y \leq 5$) of the first metal.

Each of the second interface layer 164 and the second interface layer 174 that constitute the outer interface layer may include the first metal or an oxide $M_qO_r$ (where M is the first metal, q is equal to 1, O is oxygen, and r is equal to 1 or 2) of the first metal. According to exemplary embodiments, the second interface layer 164 and the second interface layer 174 may include conductive layers, respectively.

According to exemplary embodiments, the first interface layer 162 and the second interface layer 164 that constitute the lower interface layer 160 may include different materials selected from Mo, $MoO_2$, and $MoO_3$. According to some other embodiments, the first interface layer 162 and the second interface layer 164 that constitute the lower interface layer 160 may include different materials selected from Nb, NbO, $NbO_2$, and $Nb_2O_5$. According to exemplary embodiments, the first interface layer 162 and the second interface layer 164 that constitute the lower interface layer 160 may include different materials selected from Sn, SnO, and $SnO_2$.

For example, the first interface layer 162, which is an inner interface layer within the lower interface layer 160, may include $MoO_2$, $MoO_3$, or a combination thereof, and the second interface layer 164, which is an outer interface layer within the lower interface layer 160, may include Mo, $MoO_2$, or a combination thereof and may include a metal oxide having less oxygen content (e.g., less oxygen included therein) than that of the first interface layer 162. For example, a stack structure of the second interface layer 164/first interface layer 162 may be a $Mo/MoO_2$, $Mo/MoO_3$, or $MoO_2/MoO_3$ stack structure.

As another example, the first interface layer 162, which is the inner interface layer within the lower interface layer 160, may include NbO, $NbO_2$, $Nb_2O_5$, or a combination thereof, and the second interface layer 164, which is the outer interface layer within the lower interface layer 160, may include Nb, NbO, $NbO_2$, or a combination thereof and may include a metal oxide having less oxygen content (e.g., less oxygen included therein) than that of the first interface layer 162. For example, the stack structure of the second interface layer 164/first interface layer 162 may be an Nb/NbO, $Nb/NbO_2$, $Nb/Nb_2O_5$, $NbO/NbO_2$, $NbO/Nb_2O_5$, or $NbO_2/Nb_2O_5$ stack structure.

As another example, the first interface layer 162, which is the inner interface layer within the lower interface layer 160, may include SnO, $SnO_2$, or a combination thereof, and the second interface layer 164, which is the outer interface layer within the lower interface layer 160, may include Sn, SnO, or a combination thereof and may include a metal oxide having less oxygen content (e.g., less oxygen included therein) than that of the first interface layer 162. For example, the stack structure of the second interface layer 164/first interface layer 162 may be a Sn/SnO, $Sn/SnO_2$, or $SnO/SnO_2$ stack structure.

According to exemplary embodiments, the first interface layer 172 and the second interface layer 174 that constitute the upper interface layer 170 may include different materials selected from Mo, $MoO_2$, and $MoO_3$. According to exemplary embodiments, the first interface layer 172 and the second interface layer 174 that constitute the upper interface layer 170 may include different materials selected from Nb, NbO, $NbO_2$, and $Nb_2O_5$. According to exemplary embodiments, the first interface layer 172 and the second interface layer 174 that constitute the upper interface layer 170 may include different materials selected from Sn, SnO, and $SnO_2$.

For example, the first interface layer 172, which is an inner interface layer within the upper interface layer 170, may include $MoO_2$, $MoO_3$, or a combination thereof, and the second interface layer 174, which is an outer interface layer within the upper interface layer 170, may include Mo, $MoO_2$, or a combination thereof and may include a material having less oxygen content (e.g., less oxygen included therein) than that of the first interface layer 172. For example, a stack structure of the first interface layer 172/second interface layer 174 may be a $MoO_2/Mo$, $MoO_3/Mo$, or $MoO_3/MoO_2$ stack structure.

As another example, the first interface layer 172, which is the inner interface layer within the upper interface layer 170, may include NbO, $NbO_2$, $Nb_2O_5$, or a combination thereof, and the second interface layer 174, which is the outer interface layer within the upper interface layer 170, may include Nb, NbO, $NbO_2$, or a combination thereof and may include a material having less oxygen content (e.g., less oxygen included therein) than that of the first interface layer 172. For example, the stack structure of the first interface layer 172/second interface layer 174 may be an NbO/Nb, $NbO_2/Nb$, $Nb_2O_5/Nb$, $NbO_2/NbO$, $Nb_2O_5/NbO$, or $Nb_2O_5/NbO_2$ stack structure.

As another example, the first interface layer 172, which is the inner interface layer within the upper interface layer 170, may include SnO, $SnO_2$, or a combination thereof, and the second interface layer 174, which is the outer interface layer within the upper interface layer 170, may include Sn, SnO, or a combination thereof and may include a material having less oxygen content (e.g., less oxygen included therein) than that of the first interface layer 172. For example, the stack structure of the first interface layer 172/second interface layer 174 may be a SnO/Sn, $SnO_2/Sn$, or $SnO_2/SnO$ stack structure.

Each of the lower electrode 130 and the upper electrode 140 may include metal, metal nitride, metal oxide, or a combination thereof. According to exemplary embodiments, each of the lower electrode 130 and the upper electrode 140 may include TiN, MoN, NbN, CoN, TaN, TiAlN, TaAlN, W, Ru, $RuO_2$, $SrRuO_3$, Ir, $IrO_2$, Pt, PtO, $SRO(SrRuO_3)$, $BSRO((Ba,Sr)RuO_3)$, $CRO(CaRuO_3)$, LSCo $((La,Sr)CoO_3)$, or a combination thereof. However, the material used to form each of the lower electrode 130 and the upper electrode 140 is not limited thereto.

According to exemplary embodiments, at least one of the lower electrode 130 and the upper electrode 140 may include a first metal included in the lower interface layer 160 and the upper interface layer 170, a nitride of the first metal, an oxide of the first metal, or a combination thereof. For example, at least one of the lower electrode 130 and the upper electrode 140 may include a conductive layer including Mo, MoN, Nb, NbN, Sn, SnO, W, Ru, TiN, WN, CoN, or a combination thereof.

According to exemplary embodiments, at least one of the lower electrode 130 and the upper electrode 140 may include a second metal that is different from the first metal included in the lower interface layer 160 and the upper interface layer 170, a nitride of the second metal, or a combination thereof. For example, at least one of the lower electrode 130 and the upper electrode 140 may include a conductive layer including TaN, TiAlN, TaAlN, Ir, Pt, or a combination thereof.

The dielectric layer 150 may include a metal oxide. According to exemplary embodiments, the dielectric layer 150 may include $HfO_2$, $ZrO_2$, $Al_2O_3$, $La_2O_3$, $Ta_2O_3$, $TiO_2$, or a combination thereof. The dielectric layer 150 may include a single layer including one of the aforementioned materials, or a multi-layer obtained by stacking a plurality of layers including different materials selected from the aforementioned materials.

The dielectric layer 150 may include a third metal that is different from the first metal included in the lower interface layer 160 and the upper interface layer 170. For example, the third metal may be, but is not limited thereto, Zr or Hf.

According to exemplary embodiments, electronegativity of the first metal included in the lower interface layer 160 and the upper interface layer 170 may be greater than electronegativity of a metal used to form the dielectric layer 150. For example, when the metal used to form the dielectric layer 150 is Zr (electronegativity of 1.33) or Hf (electronegativity of 1.3), the first metal may be Mo (electronegativity of 2.16) or Nb (electronegativity of 1.6).

The lower interface layer 160 interposed between the lower electrode 130 and the dielectric layer 150 may lower a valence band offset (VBO) and increase a conduction band offset (CBO). As the CBO increases, a potential barrier between the lower electrode 130 and the dielectric layer 150 may increase, and accordingly, oxygen included in the dielectric layer 150 may be prevented from moving into the lower electrode 130. Accordingly, the lower interface layer 160 interposed between the lower electrode 130 and the dielectric layer 150 may prevent degradation of electrical characteristics of the dielectric layer 150 and may suppress a leakage current in the capacitor C1.

Similarly, the upper interface layer 170 interposed between the dielectric layer 150 and the upper electrode 140 may lower the VBO and increase the CBO. Accordingly, a potential barrier between the dielectric layer 150 and the upper electrode 140 may be increased, and thus, oxygen within the dielectric layer 150 may be prevented from moving into the upper electrode 140. Thus, the upper interface layer 170 interposed between the dielectric layer 150 and the upper electrode 140 may prevent degradation of electrical characteristics of the dielectric layer 150, and accordingly may suppress a leakage current in the capacitor C1.

When, in the lower interface layer 160 and the upper interface layer 170, the oxygen contents of the second interface layer 164 and the second interface layer 174, constituting the outer interface layer and being closer to the lower electrode 130 and the upper electrode 140 than the first interface layer 162 and the first interface layer 172, are less than those of the first interface layer 162 and the first interface layer 172 constituting the inner interface layer, even when oxygen diffusion from the first interface layer 162 and/or the first interface layer 172 toward the lower electrode 130 and/or the upper electrode 140 occurs during a thermal treatment process performed after formation of the dielectric layer 150 or after formation of the capacitor C1, oxygen from the first interface layer 162 and/or the first interface layer 172 is captured or blocked by the second interface layer 164 and/or the second interface layer 174. As a result, the oxygen is not diffused to the lower electrode 130 and/or the upper electrode 140. Thus, a resistance increase in the lower electrode 130 and the upper electrode 140 may be prevented or reduced.

According to exemplary embodiments, respective thicknesses of the lower interface layer 160 and the upper interface layer 170 may be less than a thickness of the dielectric layer 150. For example, each of the lower interface layer 160 and the upper interface layer 170 may have a thickness of about 1 Å to about 15 Å. However, exemplary embodiments are not limited thereto.

The first interface layer 162 and the second interface layer 164 in the lower interface layer 160 may have the same thickness or different thicknesses. The respective thicknesses of the first interface layer 162 and the second interface layer 164 may vary according to electrical characteristics necessary for the capacitor C1. Similarly, the first interface layer 172 and the second interface layer 174 in the upper interface layer 170 may have the same thickness or different thicknesses. The respective thicknesses of the first interface layer 172 and the second interface layer 174 may vary according to electrical characteristics necessary for the capacitor C1.

The first interface layer 162 and the second interface layer 164 constituting the lower interface layer 160 may include impurities, such as carbon atoms, that remain as a result of not being removed during a deposition process for forming the first interface layer 162 and the second interface layer 164. A content of the impurities in each of the first interface layer 162 and the second interface layer 164 may be less than about 5 atom %. Similarly, each of the first interface layer 172 and the second interface layer 174 in the upper interface layer 170 may include impurities of less than about 5 atom %.

According to exemplary embodiments, the lower interface layer 160 and the upper interface layer 170 may be formed by an atomic layer deposition (ALD) or chemical vapor deposition (CVD) process. However, exemplary embodiments are not limited thereto.

Figure 2:
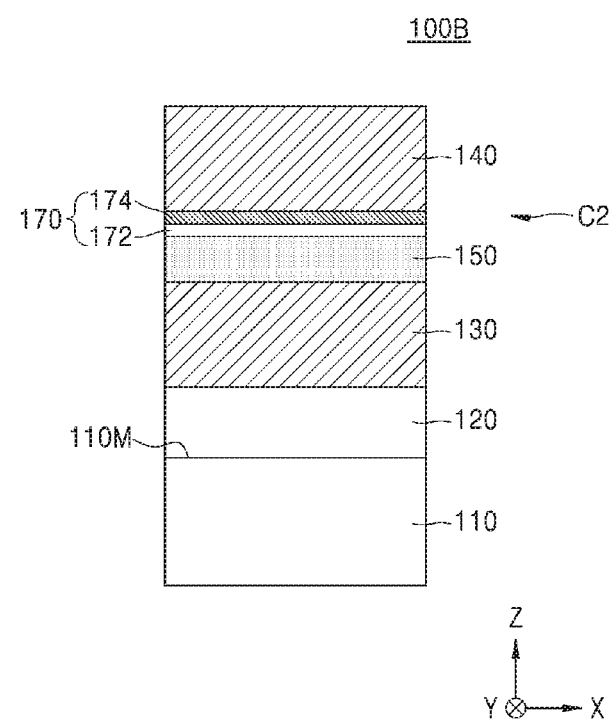
FIG. 2 is a cross-sectional view illustrating components of an IC device according to exemplary embodiments of the inventive concept.

FIG. 2 is a cross-sectional view illustrating components of an IC device 100B according to exemplary embodiments of the inventive concept. The same reference numerals in FIG. 2 as those in FIG. 1 denote the same elements. Thus, for convenience of explanation, a further description of these elements will be omitted.

Referring to FIG. 2, a capacitor C2 of the IC device 100B has a similar structure as that of the capacitor C1 of the IC device 100A of FIG. 1. However, in the capacitor C2 of the IC device 100B, the lower interface layer 160 is not interposed between the lower electrode 130 and the dielectric layer 150. For example, the dielectric layer 150 may be formed directly on the lower electrode 130, and the dielectric layer 150 and the lower electrode 130 may contact (e.g., directly contact) each other.

According to the IC device 100B of FIG. 2, the upper interface layer 170 may be interposed between the dielectric layer 150 and the upper electrode 140, and thus, a potential barrier between the dielectric layer 150 and the upper electrode 140 may be increased, leading to suppression of movement of the oxygen in the dielectric layer 150 into the upper electrode 140. Accordingly, degradation of electrical characteristics of the dielectric layer 150 may be prevented, and a leakage current in the capacitor C2 may be suppressed. When the oxygen content of the second interface layer 174, which is an outer interface layer closer to the upper electrode 140, is less than that of the first interface layer 172, which is an inner interface layer, within the upper interface layer 170, even when oxygen diffusion from the first interface layer 172 toward the upper electrode 140 occurs during a thermal treatment process subsequent to formation of the capacitor C2, oxygen from the first interface layer 172 is captured or blocked by the second interface layer 174, and accordingly is not diffused to the upper electrode 140. Thus, a resistance increase in the upper electrode 140 may be prevented or reduced.

Figure 3:
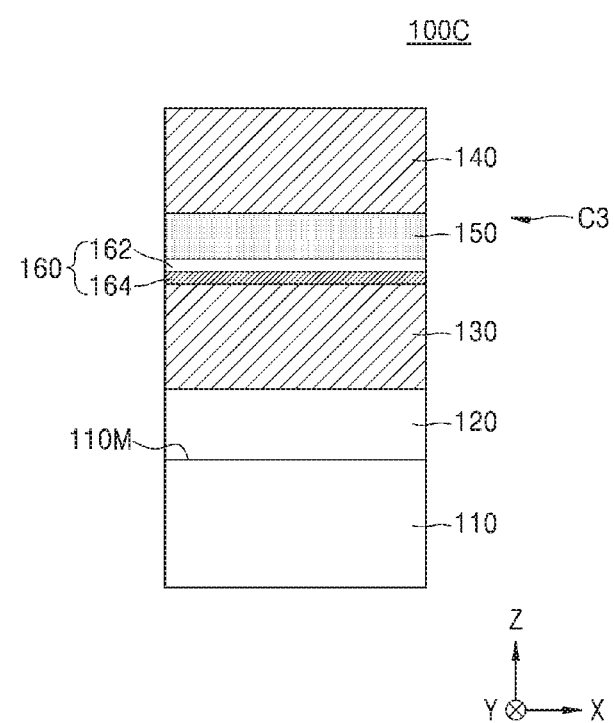
FIG. 3 is a cross-sectional view illustrating components of an IC device according to exemplary embodiments of the inventive concept.

FIG. 3 is a cross-sectional view illustrating components of an IC device 100C according to exemplary embodiments of the inventive concept. The same reference numerals in FIG.

3 as those in FIG. 1 denote the same elements. Thus, for convenience of explanation, a further description of these elements will be omitted.

Referring to FIG. 3, a capacitor C3 of the IC device 100C has a similar structure as that of the capacitor C1 of the IC device 100A of FIG. 1. However, in the capacitor C3 of the IC device 100C, the upper interface layer 170 is not interposed between the dielectric layer 150 and the upper electrode 140. Thus, the upper electrode 140 may be formed directly on the dielectric layer 150, and the dielectric layer 150 and the upper electrode 140 may contact (e.g., directly contact) each other.

According to the IC device 100C of FIG. 3, the lower interface layer 160 may be interposed between the lower electrode 130 and the dielectric layer 150, and thus, a potential barrier between the lower electrode 130 and the dielectric layer 150 may be increased, leading to suppression of movement of oxygen in the dielectric layer 150 into the lower electrode 130. Accordingly, degradation of electrical characteristics of the dielectric layer 150 may be prevented, and a leakage current in the capacitor C3 may be suppressed. When the oxygen content of the second interface layer 164, which is an outer interface layer closer to the lower electrode 130, is less than that of the first interface layer 162, which is an inner interface layer within the lower interface layer 160, even when oxygen diffusion from the first interface layer 162 toward the lower electrode 130 occurs during formation of the dielectric layer 150 or during a thermal treatment process subsequent to formation of the capacitor C3, oxygen from the first interface layer 162 is captured or blocked by the second interface layer 164. As a result, the oxygen is not diffused to the lower electrode 130. Thus, a resistance increase in the lower electrode 130 may be prevented or reduced.

Figure 4:
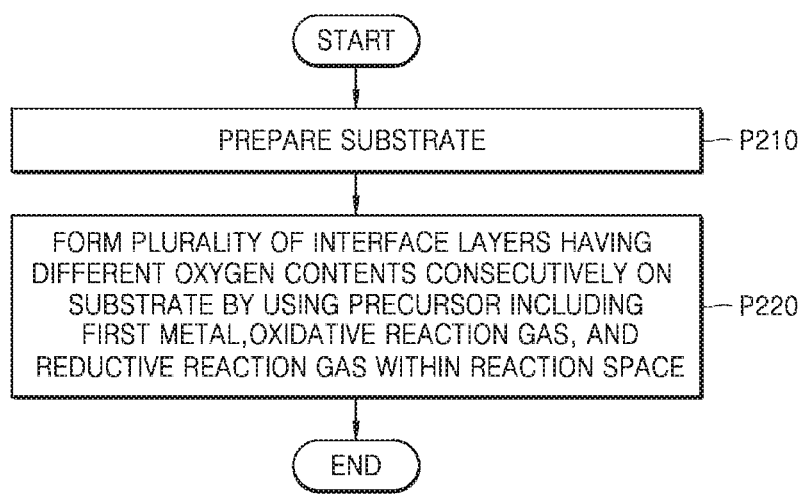
FIG. 4 is a flowchart of a method of manufacturing an IC device according to exemplary embodiments of the inventive concept.

FIG. 4 is a flowchart of a method of manufacturing an IC device according to exemplary embodiments of the inventive concept.

In process P210 of FIG. 4, a substrate is prepared. The substrate may have the same configuration as that of the substrate 110 described above with reference to FIG. 1.

In process P220 of FIG. 4, a plurality of interface layers having different oxygen contents are consecutively formed on the substrate by using a precursor including a first metal, an oxidative reaction gas, and a reductive reaction gas within a reaction space.

The reaction space may be provided by a chamber for performing an ALD process, or a chamber for performing a CVD process. According to exemplary embodiments, the reaction space may be a reaction space RS that is provided by a chamber 410 of one of IC device manufacturing apparatuses 400A, 400B, and 400C, which will be described later with reference to FIGS. 8 through 10.

The first metal may be selected from, for example, Mo, Nb, Sn, Ta, Ti, In, Ni, Co, W, and Ru. The precursor including the first metal may include central atoms including the first metal, and at least one ligand combined with the central atoms. The ligand may include, but is not limited to, a cyclopentadienyl group, a saturated or unsaturated hydrocarbon group of C1 to C10, an organic amine group of C1 to C10, or halogen.

For example, when the first metal is Mo, an Mo precursor may include $(CpR)_2Mo(NR')$ (where each of R and R' is H or an alkyl group of C1 to C10 and Cp indicates a cyclopentadienyl group), or an Mo halide. When the first metal is Nb, an Nb precursor may include $(RN)Nb(NR'R'')_3$ (where each of R, R', and R'' is H or an alkyl group of C1 to C10), or an Nb halide. When the first metal is Sn, an Sn precursor may include $R_2Sn(NR'R'')_2$ (where each of R, R', and R'' is H or an alkyl group of C1 to C10), or an Sn halide.

The precursor of the first metal is not limited to the aforementioned examples, and may be selected from other precursors. According to exemplary embodiments, the precursor including the first metal may be a liquid at room temperature.

In the method of manufacturing an IC device, according to exemplary embodiments of the inventive concept, to form the plurality of interface layers, the inside of the reaction space may be kept at a temperature of about 100° C. to about 600° C., and, at the same time, the precursor including the first metal may be supplied onto the substrate. According to exemplary embodiments, an internal pressure of the reaction space may be kept at about 10 Pa to an atmospheric pressure. According to exemplary embodiments, the precursor including the first metal may be solely provided onto the substrate to form the plurality of interface layers. According to exemplary other embodiments, a multi-component raw material including a mixture of at least one of a precursor including a metal different from the first metal, a reaction gas, and an organic solvent with the precursor including the first metal, may be provided onto the substrate to form the plurality of interface layers. A time period during which the supply gases are supplied into the reaction space once may be kept at least 0.1 seconds. The precursor and the reaction gas may be simultaneously or sequentially supplied onto the substrate.

According to exemplary embodiments, the oxidative reaction gas may include, but is not limited to, $O_2$, $O_3$, $H_2O$, NO, $NO_2$, $N_2O$, $CO_2$, $H_2O_2$, HCOOH, $CH_3COOH$, $(CH_3CO)_2O$, plasma $O_2$, remote plasma $O_2$, plasma $N_2O$, plasma $H_2O$, or a combination thereof.

According to exemplary embodiments, the reductive reaction gas may include, but is not limited to, $H_2$, $NH_3$, $GeH_4$, hydrazine ($N_2H_4$), hydrazine derivatives, or a combination thereof. The hydrazine derivatives may be selected from, for example, alkylhydrazine of C1 to C10, dialkylhydrazine, or a combination thereof.

In process P220 of FIG. 4, the plurality of interface layers may include a first interface layer having relatively large oxygen content and a second interface layer having relatively large oxygen content. When the plurality of interface layers are formed, the order in which the first interface layer and the second interface layer are formed is not particularly limited. For example, according to exemplary embodiments, the second interface layer may be formed after the first interface layer is formed, or the first interface layer may be formed after the second interface layer is formed.

According to exemplary embodiments, the plurality of interface layers formed in process P220 of FIG. 4 may include the first interface layer 162 and the second interface layer 164 illustrated in FIGS. 1 and 3. According to exemplary embodiments, the plurality of interface layers formed in process P220 of FIG. 4 may include the first interface layer 172 and the second interface layer 174 illustrated in FIGS. 1 and 2.

To form the first interface layer 162 and the second interface layer 164 of FIGS. 1 and 3 according to process P220 of FIG. 4, the second interface layer 164 may first be formed on the lower electrode 130 within the reaction space, and then the first interface layer 162 may be formed in-situ with a process of forming the second interface layer 164 within the reaction space.

To form the first interface layer 172 and the second interface layer 174 of FIGS. 1 and 2 according to process P220 of FIG. 4, the first interface layer 172 may first be formed on the dielectric layer 150 within the reaction space, and then the second interface layer 174 may be formed in-situ with a process of forming the first interface layer 172 within the reaction space.

Figure 5A:
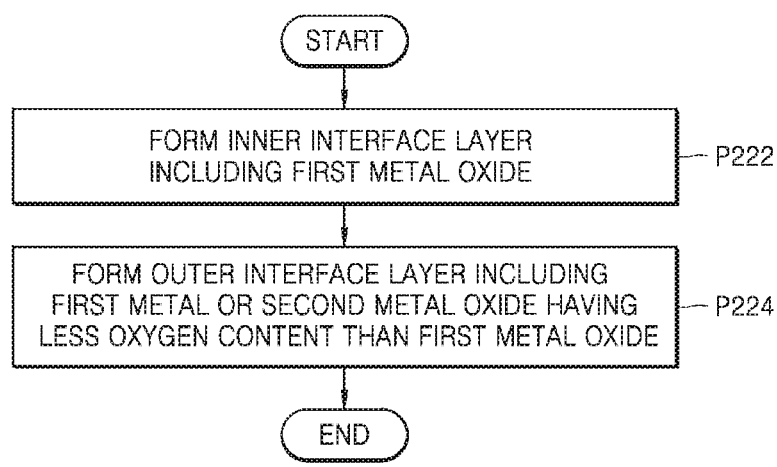
FIG. 5A is a flowchart of a method of manufacturing an IC device according to exemplary embodiments of the inventive concept.

FIG. 5A is a flowchart of a method of manufacturing an IC device according to exemplary embodiments of the inventive concept. An exemplary method of consecutively forming a plurality of interface layers according to process P220 of FIG. 4 will be described with reference to FIG. 5A.

Referring to FIG. 5A, in process P222, an inner interface layer including a first metal oxide including a first metal is formed.

According to exemplary embodiments, the inner interface layer including the first metal oxide may be formed using a precursor including the first metal and an oxidative reaction gas. According to exemplary embodiments, the inner interface layer including the first metal oxide may be formed using a precursor including the first metal, an oxidative reaction gas, and a reductive reaction gas. Detailed configurations of the precursor including the first metal, the oxidative reaction gas, and the reductive reaction gas are the same as those given above with reference to FIG. 4.

The first metal may be selected from, for example, Mo, Nb, Sn, Ta, Ti, In, Ni, Co, W, and Ru. According to exemplary embodiments, the first metal oxide may include $MoO_2$, $MoO_3$, or a combination thereof. According to exemplary embodiments, the first metal oxide may include NbO, $NbO_2$, $Nb_2O_5$, or a combination thereof. According to exemplary embodiments, the first metal oxide may include SnO, $SnO_2$, or a combination thereof. However, exemplary embodiments of the inventive concept are not limited to these exemplified materials.

In process P224 of FIG. 5A, an outer interface layer including the first metal or a second metal oxide including the first metal is formed on the inner interface layer formed in process P222. The second metal oxide may have less oxygen content than the first metal oxide formed in process P222.

Process P224 of forming the outer interface layer may be consecutively performed in-situ without vacuum break after process P222 of forming the inner interface layer.

According to exemplary embodiments, the outer interface layer including the second metal oxide may be formed using a precursor including the first metal, an oxidative reaction gas, and a reductive reaction gas. Detailed configurations of the precursor including the first metal, the oxidative reaction gas, and the reductive reaction gas are the same as those given above with reference to FIG. 4.

According to exemplary embodiments, the outer interface layer may include, for example, Mo, $MoO_2$, or a combination thereof. According to exemplary embodiments, the outer interface layer may include, for example, Nb, NbO, $NbO_2$, or a combination thereof. According to exemplary embodiments, the outer interface layer may include, for example, Sn, SnO, or a combination thereof. However, exemplary embodiments of the inventive concept are not limited to these exemplified materials.

The first interface layer 172 and the second interface layer 174 of the upper interface layer 170 illustrated in FIGS. 1 and 2 may be sequentially formed using the method described above with reference to FIG. 5A. For example, the first interface layer 172 of FIGS. 1 and 2 may be formed according to process P222 of FIG. 5A, and the second interface layer 174 of FIGS. 1 and 2 may be formed according to process P224 of FIG. 5A.

Figure 5B:
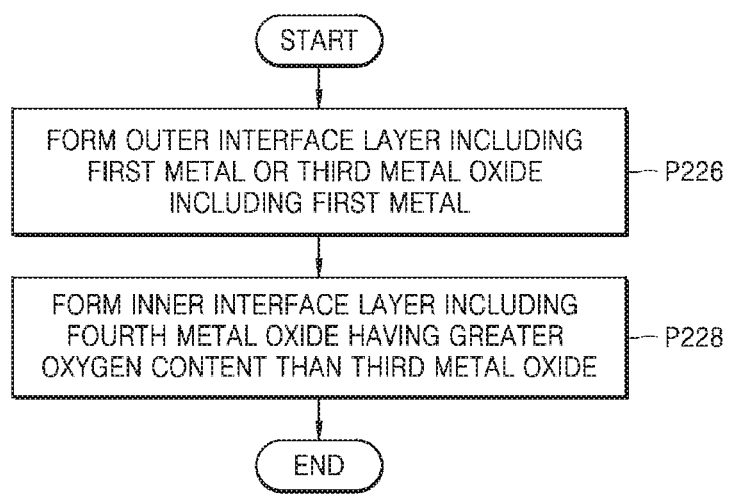
FIG. 5B is a flowchart of a method of manufacturing an IC device according to exemplary embodiments of the inventive concept.

FIG. 5B is a flowchart of a method of manufacturing an IC device according to exemplary embodiments of the inventive concept. Another exemplary method of consecutively forming a plurality of interface layers according to process P220 of FIG. 4 will be described with reference to FIG. 5B.

In process P226 of FIG. 5B, an outer interface layer including the first metal or a third metal oxide including the first metal is formed.

The third metal oxide may have less oxygen content than a fourth metal oxide which will be described later with reference to process P228 of FIG. 5B. The outer interface layer formed in process P226 may have substantially the same configuration as that of the outer interface layer formed in process P224 of FIG. 5A.

According to exemplary embodiments, the outer interface layer including the third metal oxide may be formed using a precursor including the first metal, an oxidative reaction gas, and a reductive reaction gas. Detailed configurations of the precursor including the first metal, the oxidative reaction gas, and the reductive reaction gas are the same as those given above with reference to FIG. 4.

In process P228 of FIG. 5B, an inner interface layer including a fourth metal oxide having greater oxygen content than the third metal oxide is formed.

The inner interface layer formed in process P228 may have substantially the same configuration as that of the inner interface layer formed in process P222 of FIG. 5A. A detailed configuration of the fourth metal oxide is substantially the same as that of the first metal oxide described above with reference to FIG. 5A.

Process P228 of forming the inner interface layer may be consecutively performed in-situ without vacuum break after process P226 of forming the outer interface layer.

According to exemplary embodiments, the inner interface layer including the fourth metal oxide may be formed using a precursor including the first metal and an oxidative reaction gas. According to exemplary embodiments, the inner interface layer including the fourth metal oxide may be formed using a precursor including the first metal, an oxidative reaction gas, and a reductive reaction gas. Detailed configurations of the precursor including the first metal, the oxidative reaction gas, and the reductive reaction gas are the same as those given above with reference to FIG. 4.

The second interface layer 164 and the first interface layer 162 of the lower interface layer 160 illustrated in FIGS. 1 and 3 may be sequentially formed using the method described above with reference to FIG. 5B. For example, the second interface layer 164 of FIGS. 1 and 3 may be formed according to process P226 of FIG. 5B, and the first interface layer 162 of FIGS. 1 and 3 may be formed according to process P228 of FIG. 5B.

Figure 6:
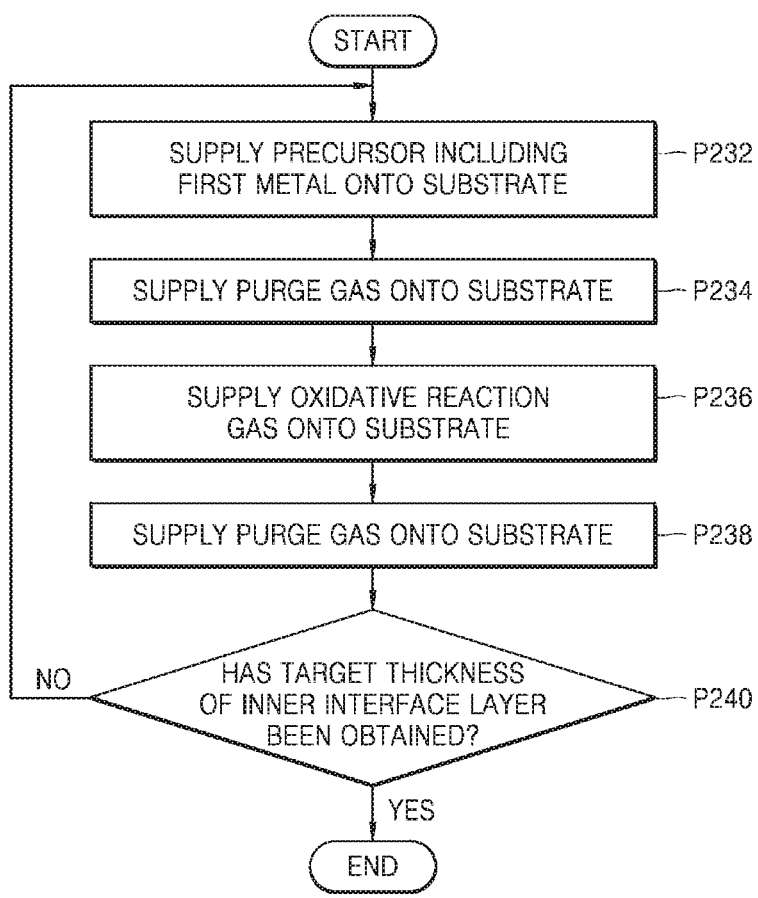
FIG. 6 is a flowchart of an exemplary method of forming a plurality of interface layers having different oxygen contents according to exemplary embodiments of the inventive concept.

FIG. 6 is a flowchart of an exemplary method of forming a plurality of interface layers having different oxygen contents according to exemplary embodiments of the inventive concept.

Referring to FIG. 6, a method of forming an inner interface layer via an ALD process according to process P222 of FIG. 5A or process P228 of FIG. 5B will now be described.

Referring to FIG. 6, in process P232, a metal precursor layer including a first metal is formed by supplying a precursor including the first metal onto a substrate within a reaction space.

The reaction space may be provided by a chamber for performing an ALD process. According to exemplary embodiments, the reaction space may be the reaction space RS that is provided by the chamber 410 of one of the IC device manufacturing apparatuses 400A, 400B, and 400C, which will be described later with reference to FIGS. 8 through 10.

The substrate may have the same configuration as that of the substrate 110 described above with reference to FIG. 1. The first metal may be selected from, for example, Mo, Nb, Sn, Ta, Ti, In, Ni, Co, W, and Ru. The precursor including the first metal may be supplied in a vaporized state onto the substrate.

While the precursor including the first metal is being supplied onto the substrate, the inside of the reaction space may be kept at a temperature of about 100° C. to about 600° C. By supplying a vaporized precursor onto the substrate in process P232, a chemisorbed layer and a physisorbed layer of the precursor including the first metal may be formed on the substrate.

In process P234 of FIG. 6, while the inside of the reaction space is being kept at a temperature of about 100° C. to about 600° C., a purge gas is supplied onto the substrate to thereby remove unnecessary by-products on the substrate. At this time, the physisorbed layer of the precursor remaining on the substrate may also be removed. An inert gas, such as, for example, Ar, He, or Ne, or an $N_2$ gas, may be used as the purge gas.

In process P236 of FIG. 6, an oxidative reaction gas is supplied onto the substrate to thereby form a metal oxide layer including an oxide of the first metal from the metal precursor layer formed in process P232.

The oxidative reaction gas may include, but is not limited to, $O_2$, $O_3$, plasma $O_2$, $H_2O$, $NO_2$, $NO$, $N_2O$ (nitrous oxide), $CO_2$, $H_2O_2$, HCOOH, $CH_3COOH$, $(CH_3CO)_2O$, or a combination thereof.

According to exemplary embodiments, the metal oxide layer may include, for example, $MoO_2$, $MoO_3$, or a combination thereof. According to exemplary embodiments, the metal oxide layer may include, for example, NbO, $NbO_2$, $Nb_2O_5$, or a combination thereof. According to exemplary embodiments, the metal oxide layer may include, for example, SnO, $SnO_2$, or a combination thereof. However, exemplary embodiments of the inventive concept are not limited to these exemplified materials.

In process P238 of FIG. 6, a purge gas is supplied onto the substrate to thereby remove unnecessary by-products on the substrate. An inert gas such as, for example, Ar, He, or Ne, or an $N_2$ gas, may be used as the purge gas.

In process P240 of FIG. 6, it is determined whether a target thickness of the inner interface layer has been obtained, and a deposition cycle of processes P232 through P238 may be repeated several times until the target thickness of the inner interface layer is obtained. When it is determined in process P240 that the target thickness of the inner interface layer has been obtained, the processes described above with reference to FIG. 6 may be concluded.

Figure 7:
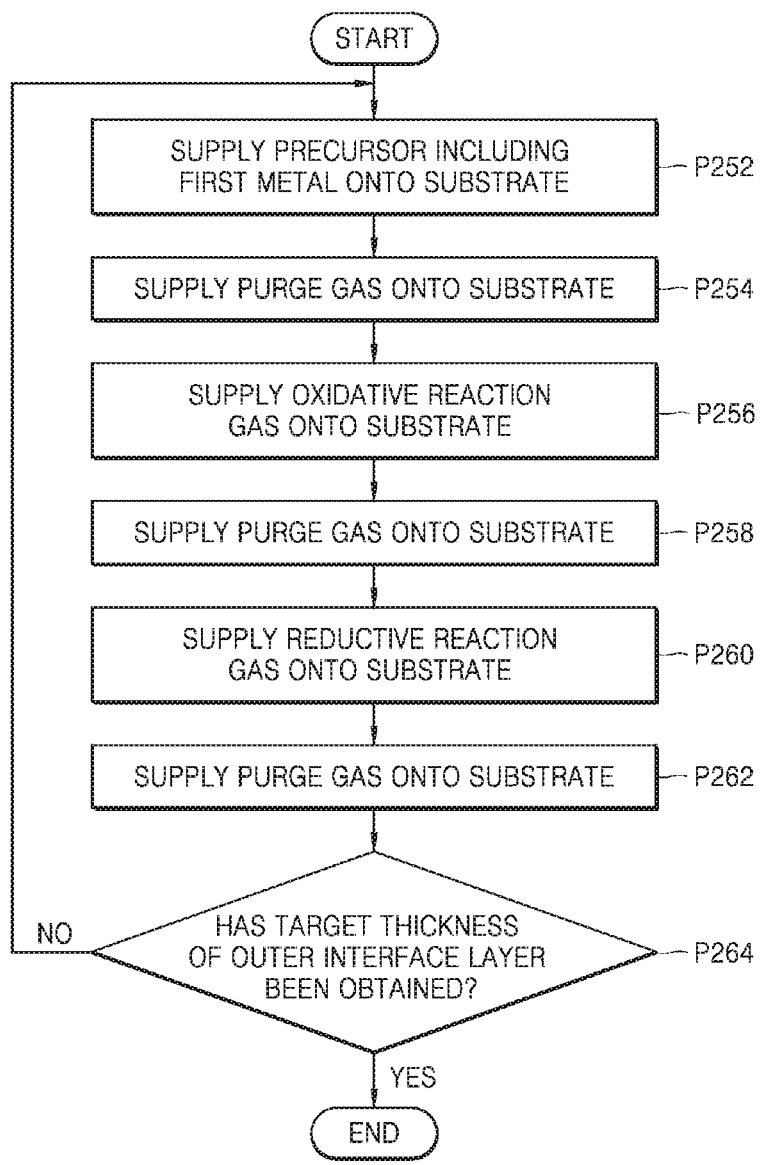
FIG. 7 is a flowchart of an exemplary method of forming a plurality of interface layers having different oxygen contents according to exemplary embodiments of the inventive concept.

FIG. 7 is a flowchart of an exemplary method of forming a plurality of interface layers having different oxygen contents according to exemplary embodiments of the inventive concept.

Referring to FIG. 7, a method of forming an outer interface layer by using an ALD process according to process P224 of FIG. 5A or process P226 of FIG. 5B will now be described.

Referring to FIG. 7, in process P252, according to the same method as that of process P232 described above with reference to FIG. 6, a metal precursor layer including a first metal is formed by supplying a precursor including the first metal onto a substrate within a reaction space.

In process P254 of FIG. 7, according to the same method as that of process P234 described above with reference to FIG. 6, a purge gas is supplied onto the substrate to thereby remove unnecessary by-products on the substrate.

In process P256 of FIG. 7, according to the same method as that of process P236 described above with reference to FIG. 6, an oxidative reaction gas is supplied onto the substrate to thereby form a metal oxide layer including an oxide of the first metal.

According to exemplary embodiments, the metal oxide layer obtained in process P256 of FIG. 7 may include, for example, $MoO_2$, $MoO_3$, or a combination thereof. According to exemplary embodiments, the metal oxide layer obtained in process P256 of FIG. 7 may include, for example, NbO, $NbO_2$, $Nb_2O_5$, or a combination thereof. According to exemplary embodiments, the metal oxide layer obtained in process P256 of FIG. 7 may include, for example, SnO, $SnO_2$, or a combination thereof.

In process P258 of FIG. 7, according to the same method as that of process P238 described above with reference to FIG. 6, a purge gas is supplied onto the substrate to thereby remove unnecessary by-products on the substrate.

In process P260 of FIG. 7, a reductive reaction gas is supplied onto the substrate to perform a reduction process on the metal oxide layer formed in process P256, thereby decreasing an oxygen content of the metal oxide layer. As a result, a metal layer, or a metal oxide layer having less oxygen content than the metal oxide layer formed in process P256, may be obtained.

The reductive reaction gas may include, but is not limited to, $H_2$, $NH_3$, $GeH_4$, hydrazine ($N_2H_4$), hydrazine derivatives, or a combination thereof. The hydrazine derivatives may be selected from, for example, alkylhydrazine of C1 to C10, dialkylhydrazine, or a combination thereof.

According to exemplary embodiments, the metal layer or the metal oxide layer obtained in process P260 of FIG. 7 may include, for example, Mo, $MoO_2$, or a combination thereof. According to exemplary embodiments, the metal layer or the metal oxide layer obtained in process P260 of FIG. 7 may include, for example, Nb, NbO, $NbO_2$, or a combination thereof. According to exemplary embodiments, the metal layer or the metal oxide layer obtained in process P260 of FIG. 7 may include, for example, Sn, SnO, or a combination thereof.

In process P262 of FIG. 7, according to a similar method to that of process P258 described above with reference to FIG. 7, a purge gas is supplied onto the substrate to thereby remove unnecessary by-products on the substrate.

In process P264 of FIG. 7, it is determined whether a target thickness of the outer interface layer has been obtained, and a deposition cycle of processes P252 through P262 may be repeated several times until the target thickness of the outer interface layer is obtained. When it is determined in process P264 of FIG. 7 that the target thickness of the outer interface layer has been obtained, the processes described above with reference to FIG. 7 may be concluded.

It is to be understood that the inner interface layer forming method described above with reference to FIG. 6 and the outer interface layer forming method described above with reference to FIG. 7 are merely examples. Thus, various modifications or changes may be made thereto without departing from the spirit and scope of the inventive concept.

For example, in each of process P232 of FIG. 6 and process P252 of FIG. 7 of supplying the precursor including the first metal onto the substrate, at least one of another precursor, a reaction gas, a carrier gas, and a purge gas may be simultaneously or sequentially supplied onto the substrate together with the precursor including the first metal.

In process P236 of FIG. 6 and process P256 of FIG. 7 of supplying the oxidative reaction gas onto the substrate, a plurality of oxidative reaction gases having different oxidative powers may be sequentially supplied. According to exemplary embodiments, the plurality of oxidative reaction gases may be different reaction gases selected from, for example, $O_2$, $O_3$, $H_2O$, NO, $NO_2$, $N_2O$, $CO_2$, $H_2O_2$, HCOOH, $CH_3COOH$, $(CH_3CO)_2O$, plasma $O_2$, remote plasma $O_2$, plasma $N_2O$, and plasma $H_2O$. When the plurality of oxidative reaction gases are sequentially supplied, a special purging process may be performed after a first oxidative reaction gas having first oxidative power is supplied onto the substrate and before a second oxidative reaction gas having a second oxidative power is supplied onto the substrate.

In process P260 of FIG. 7 of supplying the reductive reaction gas onto the substrate, a plurality of reductive reaction gases having different reductive powers may be sequentially supplied. According to exemplary embodiments, the plurality of reductive reaction gases may be different reaction gases selected from, for example, $H_2$, $NH_3$, $GeH_4$, hydrazine ($N_2H_4$), and hydrazine derivatives. When the plurality of reductive reaction gases are sequentially supplied, a special purging process may be performed after a first reductive reaction gas having a first reductive power is supplied onto the substrate and before a second reductive reaction gas having a second reductive power is supplied onto the substrate.

When the inner interface layer and the outer interface layer are formed using the ALD process according to the methods of FIGS. 6 and 7, the number of times of an ALD cycle may be adjusted to control a thickness of each of the inner interface layer and the outer interface layer. When the inner interface layer and the outer interface layer are formed using the ALD process according to the methods of FIGS. 6 and 7, energy, such as, for example, plasma, light, and a voltage, may be applied. A time point when energy is applied as described above may vary. For example, energy, such as, for example, plasma, light, and a voltage, may be applied when the precursor is introduced into the reaction space, when the precursor is adsorbed onto the substrate, when an exhaust process is performed using a purge gas, when the oxidative reaction gas is introduced into the reaction space, when the reductive reaction gas is introduced into the reaction space, or between times points of these events. When a precursor is supplied according to process P232 of FIG. 6 and process P252 of FIG. 7, another precursor and a reaction gas supplied together with the precursor including the first metal, and reaction conditions, may be appropriately selected. Thus, various types of inner interface layers or outer interface layers may be formed.

Figure 8:
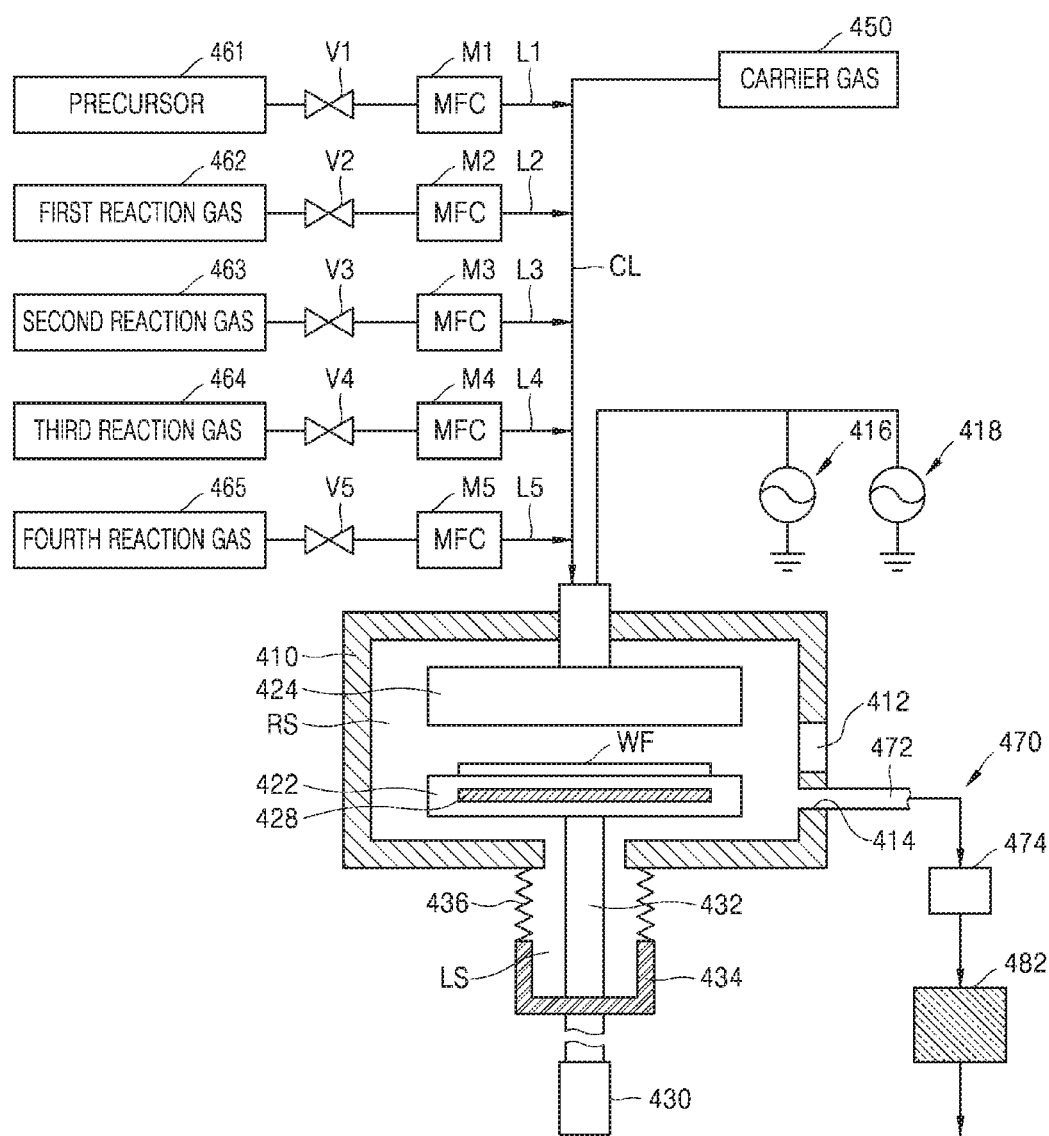
FIG. 8 is a schematic view illustrating components of an IC device manufacturing apparatus according to exemplary embodiments of the inventive concept.

FIG. 8 is a schematic view illustrating components of an IC device manufacturing apparatus 400A according to exemplary embodiments of the inventive concept.

Referring to FIG. 8, the IC device manufacturing apparatus 400A includes a chamber 410 defining a reaction space RS. A pair of electrodes, for example, a lower electrode 422 and an upper electrode 424, facing each other and extending substantially parallel to each other, may be disposed in the chamber 410.

According to exemplary embodiments, high-frequency radio frequency (HRF) power and/or low-frequency radio frequency (LRF) power may be applied to one of the lower electrode 422 and the upper electrode 424, and the other thereof may be grounded. The HRF power may be applied by a HRF power source 416, and the LRF power may be applied by a LRF power source 418. Thus, plasma may be excited between the lower electrode 422 and the upper electrode 424.

The lower electrode 422 may serve as a support that supports a substrate WF. A temperature adjuster 428 may be built into the lower electrode 422. The temperature adjuster 428 may maintain a temperature of the substrate WF supported on the lower electrode 422 at a constant temperature. The lower electrode 422 may be supported by a support member 432 connected to an elevating mechanism 430. The lower electrode 422 may be configured to be elevatable between a processing location in an upper portion of the reaction space RS and a transferring location in a lower portion thereof. The lower electrode 422 may be elevatable by the elevating mechanism 430 and the support member 432.

The upper electrode 424 may serve as a shower head. According to exemplary embodiments, gases may be introduced into the reaction space RS via the upper electrode 424.

A carrier gas (or gases) 450 necessary for a process within the chamber 410 may be supplied into the reaction space RS. According to exemplary embodiments, the carrier gas 450 may purge an unreacted material or reaction by-products within the reaction space RS. The carrier gas 450 may be, but is not limited to, an inert gas such as helium (He) or neon (Ne), or an extremely-low active gas such as nitrogen ($N_2$) or carbon dioxide ($CO_2$).

A precursor 461 and first through fourth reaction gases 462, 463, 464, and 465 may be introduced into the reaction space RS via first through fifth supply lines L, L2, L3, L4, and L5, respectively. The first through fourth reaction gases 462, 463, 464, and 465 may include, for example, an oxidative reaction gas and a reductive reaction gas. Valves V1, V2, V3, V4, and V5 and mass flow controllers (MFCs) M1, M2, M3, M4, and M5 may be mounted on the first through fifth supply lines L1, L2, L3, L4, and L5, respectively, and may independently control respective flow rates of the precursor 461 and the first through fourth reaction gases 462, 463, 464, and 465 respectively passing through the first through fifth supply lines L1, L2, L3, L4, and L5. The first through fifth supply lines L1, L2, L3, L4, and L5 may be selectively joined with a carrier gas supply line CL.

An optical viewport 412 may be included on a sidewall of the chamber 410. Gases in the reaction space RS or materials emitted from plasma may be observed or inspected via the optical viewport 412.

A flange unit 434 may be provided in a lower portion of the support member 432, and bellows 436 may be connected between a bottom surface of the chamber 410 and the flange unit 434. The bellows 436 may have a structure that is stretchable according to an elevating operation of the lower electrode 422. The flange unit 434 and the bellows 436 may define a lower space LS that is connected to the reaction space RS, and that is disposed below the chamber 410.

The IC device manufacturing apparatus 400A may include a vent hole 414 formed in the sidewall of the chamber 410, and an exhaust unit 470 connected to the vent hole 414. The exhaust unit 470 may include a vent pipe 472 connected to the vent hole 414, and an exhaust mechanism 474 connected to the vent pipe 472. The exhaust mechanism 474 may include a vacuum pump or an auto pressure control (APC) valve. The vent pipe 472 may be connected to the reaction space RS of the chamber 410 via the vent hole 414. A gas within the chamber 410 may be exhausted to outside the chamber 410 via the vent pipe 472 by the exhaust mechanism 474 of the exhaust unit 470.

The IC device manufacturing apparatus 400A may include a gas concentration measuring device 482 disposed on a downstream side of the exhaust mechanism 474. The gas concentration measuring device 482 may measure an oxygen concentration and a hydrogen concentration from gases exhausted from the chamber 410.

When the oxygen concentration or the hydrogen concentration measured by the gas concentration measuring device 482 exceeds a reference range, the IC device manufacturing apparatus 400A may control the oxygen concentration or the hydrogen concentration to be within the reference range via a purging process. According to exemplary embodiments, the reference range of the oxygen concentration may be less than about 10 vol % and the reference range of the hydrogen concentration may be less than about 4 vol %. As a result of controlling an oxygen concentration or a hydrogen concentration within a gas exhausted from the chamber 410 to be in a reference range, exemplary embodiments may eliminate the possibility of explosion due to coexistence of an oxygen gas and a hydrogen gas inside or outside the chamber 410. Accordingly, when an ALD process that accompanies an oxidation process and a reduction process is performed using the IC device manufacturing apparatus 400A, the stability in the IC device manufacturing apparatus 400A may be improved.

According to exemplary embodiments, the gas concentration measuring device 482 may include a time of flight mass spectrometer (TOFMS), an infrared spectrometer, a gas sensor using an infrared laser, or a combination thereof.

Although FIG. 8 illustrates a case in which the gas concentration measuring device 482 is disposed on the downstream side of the exhaust mechanism 474 within the IC device manufacturing apparatus 400A, exemplary embodiments are not limited thereto. For example, according to exemplary embodiments, the gas concentration measuring device 482 may be provided within the chamber 410 or in the vent pipe 472 between the chamber 410 and the exhaust mechanism 474.

Figure 9:
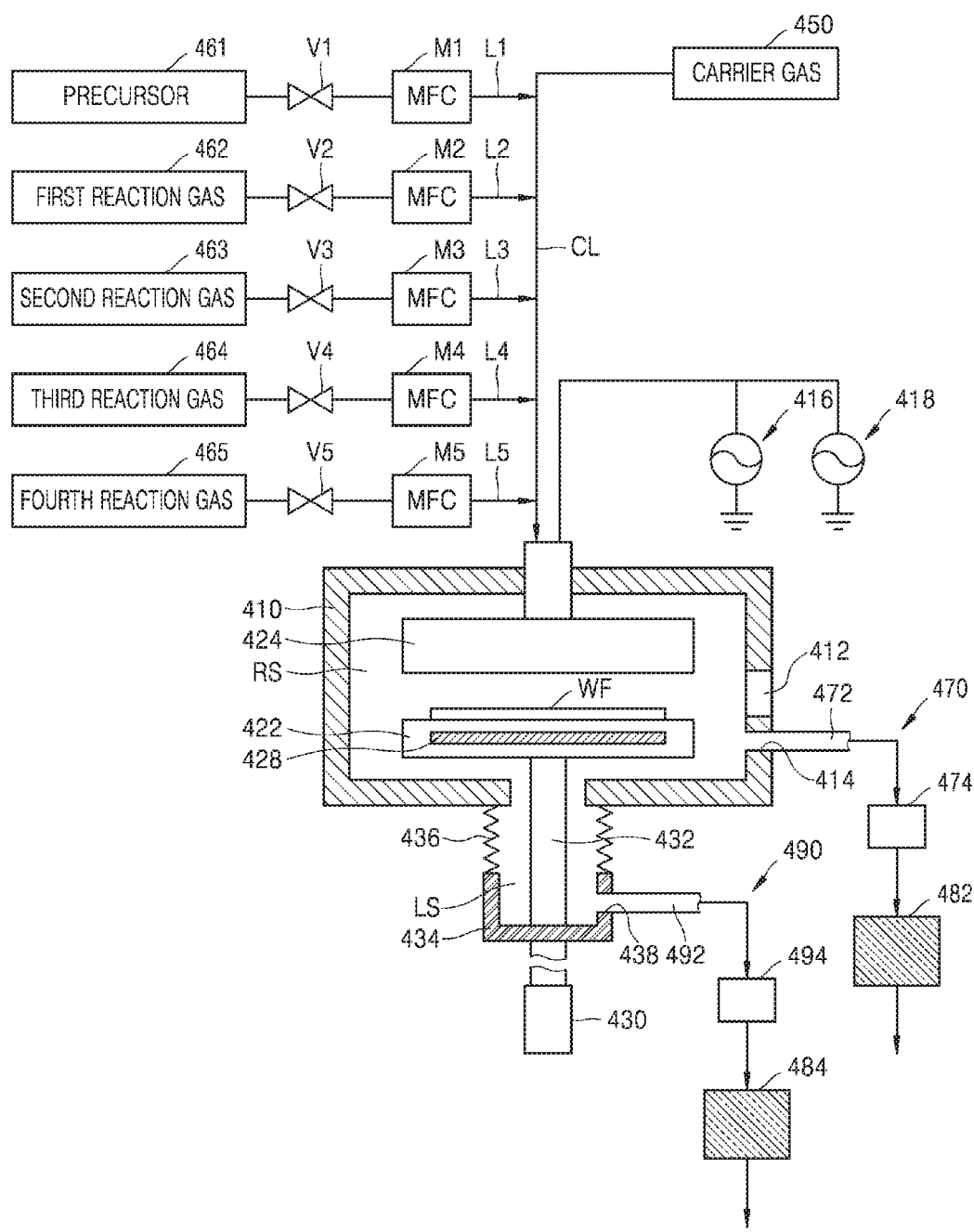
FIG. 9 is a schematic view illustrating components of an IC device manufacturing apparatus according to exemplary embodiments of the inventive concept.

FIG. 9 is a schematic view illustrating components of an IC device manufacturing apparatus 400B according to exemplary embodiments of the inventive concept.

The IC device manufacturing apparatus 400B of FIG. 9 has a similar structure as that of the IC device manufacturing apparatus 400A described above with reference to FIG. 8. However, the IC device manufacturing apparatus 400B includes a vent hole 438 formed in the flange unit 434, and an exhaust unit 490 connected to the vent hole 438. The exhaust unit 490 may include a vent pipe 492 connected to the vent hole 438, and an exhaust mechanism 494 connected to the vent pipe 492. The exhaust mechanism 494 may include a vacuum pump or an APC valve. The vent pipe 492 may be connected to the lower space LS via the vent hole 438. At least a portion of a gas within the lower space LS may be exhausted to outside of the lower space LS via the vent pipe 492 by the exhaust mechanism 494 of the exhaust unit 490.

The IC device manufacturing apparatus 400B may include a gas concentration measuring device 484 disposed on a downstream side of the exhaust mechanism 494. The gas concentration measuring device 484 may measure an oxygen concentration and a hydrogen concentration from gases exhausted from the lower space LS. A detailed structure of the gas concentration measuring device 484 is the same as that of the gas concentration measuring device 482 described above with reference to FIG. 8.

Since the lower space LS is a space connected to the reaction space RS of the chamber 410, when there are no exhaust units 490, exhaustion may not be efficiently conducted in a lower portion of the lower space LS and gases may remain in the lower space LS. However, because the exhaust unit 490 is connected to the lower space LS via the vent hole 438 formed in the flange unit 434, unnecessary gases may be efficiently exhausted via the exhaust unit 490, and thus, do not remain in the lower space LS. The gas concentration measuring device 484 disposed on the downstream side of the exhaust mechanism 494 may measure an oxygen concentration and a hydrogen concentration of gases exhausted from the lower space LS, and may monitor whether the measured oxygen concentration or hydrogen concentration exceeds a reference range.

When the oxygen concentration or the hydrogen concentration measured by the gas concentration measuring device 484 exceeds a reference range, the IC device manufacturing apparatus 400B may control the oxygen concentration or the hydrogen concentration to be included within the reference range via a purging process. As a result of controlling an oxygen concentration or a hydrogen concentration within a gas exhausted not only from the chamber 410, but also from the lower space LS, to be in a reference range, exemplary embodiments may eliminate the possibility of explosion due to coexistence of an oxygen gas and a hydrogen gas not only inside the chamber 410, but also inside the lower space LS. Accordingly, when an ALD process that accompanies an oxidation process and a reduction process is performed using the IC device manufacturing apparatus 400B, the stability in the IC device manufacturing apparatus 400B may be improved.

Although FIG. 9 illustrates a case in which the gas concentration measuring device 484 is disposed on the downstream side of the exhaust mechanism 494 within the IC device manufacturing apparatus 400B, exemplary embodiments are not limited thereto. For example, in exemplary embodiments, the gas concentration measuring device 484 may be provided within the lower space LS or in the vent pipe 492 between the lower space LS and the exhaust mechanism 494.

Figure 10:
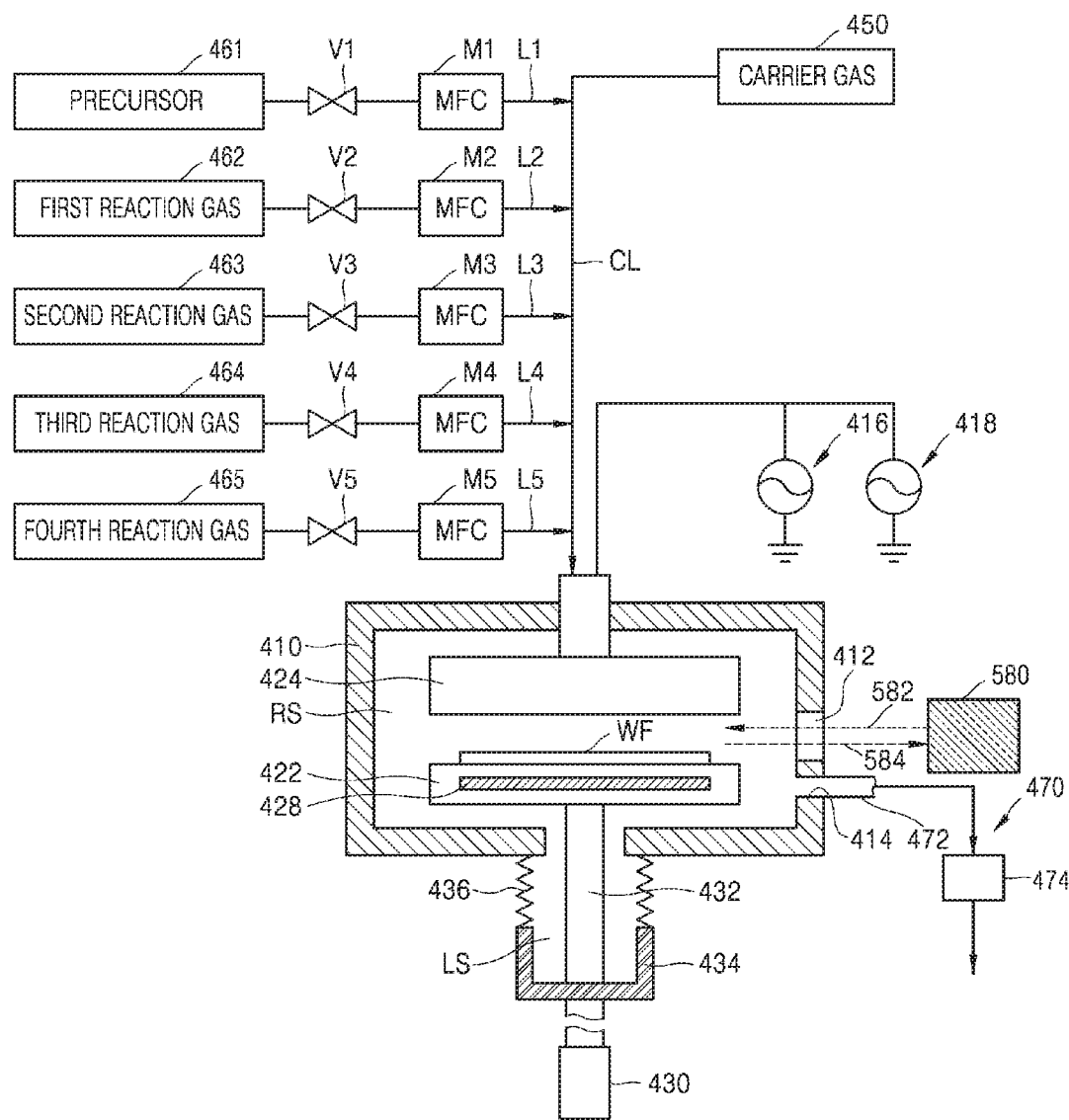
FIG. 10 is a schematic view illustrating components of an IC device manufacturing apparatus according to an exemplary embodiment of the inventive concept.

FIG. 10 is a schematic view illustrating components of an IC device manufacturing apparatus 400C according to an exemplary embodiment of the inventive concept.

The IC device manufacturing apparatus 400C of FIG. 10 has a similar structure as that of the IC device manufacturing apparatus 400A described above with reference to FIG. 8. However, the IC device manufacturing apparatus 400C includes a gas concentration measuring device 580 instead of the gas concentration measuring device 482.

According to exemplary embodiments, the gas concentration measuring device 580 may measure the concentration of a detection target gas by using characteristics that relate to specific gas molecules absorbing only light having a specific wavelength. The gas concentration measuring device 580 may be an optical gas concentration measuring device that measures a gas concentration according to a method of projecting light 582 in an infrared light band into the chamber 410 via the optical viewport 412, measuring light absorbance of detection target gas molecules from reflection light 584 reflected by the chamber 410, and converting a result of the measurement of the light absorbance into a gas concentration of a detection target gas within the chamber 410. However, a gas concentration measuring method performed by the gas concentration measuring device 580 is not limited thereto. The gas concentration measuring device 580 may measure an oxygen concentration and/or a hydrogen concentration within the chamber 410 according to various methods including a process of projecting the light 582 into the chamber 410 via the optical viewport 412.

According to exemplary embodiments, the gas concentration measuring device 580 may use a light source capable of emitting a sufficient amount of infrared light that is enough to sense a detection target gas such as, for example, an oxygen gas or a hydrogen gas, within the chamber 410. The light source may be, for example, an infrared laser light source that projects the light 582 in the infrared light band. For example, the infrared laser light source may be selected from light sources including a near infrared (NIR) band, a mid IR band, and a far IR band in a range of about 750 nm to about 1 mm.

According to exemplary embodiments, when the oxygen concentration and/or the hydrogen concentration within the chamber 410 are measured by the gas concentration measuring device 580, a plasma process is not performed within the chamber 410.

The IC device manufacturing apparatus 400C is able to measure an oxygen concentration or a hydrogen concentration within the reaction space RS of the chamber 410 by using the gas concentration measuring device 580, and is able to monitor whether the measured oxygen concentration or the measured hydrogen concentration exceeds a reference range.

When the oxygen concentration or the hydrogen concentration measured by the gas concentration measuring device 580 exceeds a reference range, the IC device manufacturing apparatus 400C may control the oxygen concentration or the hydrogen concentration to be within the reference range via a purging process. As a result of controlling an oxygen concentration or a hydrogen concentration within the chamber 410, exemplary embodiments may remove the possibility of explosion due to coexistence of an oxygen gas and a hydrogen gas within the chamber 410. Accordingly, when an ALD process that accompanies an oxidation process and a reduction process is performed using the IC device manufacturing apparatus 400C, the stability in the IC device manufacturing apparatus 400C may be improved.

Although the IC device manufacturing apparatuses 400A, 400B, and 400C having specific structures have been described above with reference to FIGS. 8 through 10, exemplary embodiments of the inventive concept are not limited to the structures illustrated in FIGS. 8 through 10. For example, an IC device manufacturing apparatus according to the inventive concept may include the gas concentration measuring device 482 of FIGS. 8 and 9, the gas concentration measuring device 484 of FIG. 9, the gas concentration measuring device 580 of FIG. 10, or a combination thereof. Further, the respective locations of these measuring devices may be provided, for example, inside or outside of the chamber 410, or inside or outside of the lower space LS.

FIG. 11 is a flowchart of an exemplary method of forming an interface layer according to exemplary embodiments of the inventive concept.

The interface layer forming method of FIG. 11 is applicable to process P220 of FIG. 4 of forming a plurality of interface layers, process P222 of FIG. 5A or process P228 of FIG. 5B of forming an inner interface layer, or process P224 of FIG. 5A or process P226 of FIG. 5B of forming an outer interface layer. According to exemplary embodiments, the interface layer forming method of FIG. 11 may be used to form at least one interface layer from among the first interface layer 162 and the second interface layer 164 of FIGS. 1 and 3 and the first interface layer 172 and the second interface layer 174 of FIGS. 1 and 2.

According to exemplary embodiments, the interface layer forming method of FIG. 11 may be performed using, for example, one of the IC device manufacturing apparatuses 400A, 400B, and 400C of FIGS. 8 through 10.

Referring to FIG. 11, in process P272, according to the same method as that of process P232 described above with reference to FIG. 6, a metal precursor layer including a first metal is formed by supplying a precursor including the first metal onto a substrate within a reaction space.

In process P274 of FIG. 11, according to the same method as that of process P234 described above with reference to FIG. 6, a purge gas is supplied onto the substrate to thereby remove unnecessary by-products on the substrate.

In process P276 of FIG. 11, according to the same method as that of process P236 described above with reference to FIG. 6, an oxidative reaction gas is supplied onto the substrate to thereby form a metal oxide layer including an oxide of the first metal.

According to exemplary embodiments, the metal oxide layer obtained in process P276 of FIG. 11 may include, for example, $MoO_2$, $MoO_3$, or a combination thereof. According to exemplary embodiments, the metal oxide layer obtained in process P276 of FIG. 11 may include, for example, NbO, $NbO_2$, $Nb_2O_5$, or a combination thereof. According to exemplary embodiments, the metal oxide layer obtained in process P276 of FIG. 11 may include, for example, SnO, $SnO_2$, or a combination thereof.

In process P278 of FIG. 11, according to the same method as that of process P238 described above with reference to FIG. 6, a purge gas is supplied onto the substrate to thereby remove unnecessary by-products on the substrate.

In process P280 of FIG. 11, an oxygen concentration within the reaction space on the substrate, or an oxygen concentration within a vent pipe connected to the reaction space, is measured.

In process P280, the oxygen concentration may be measured using the gas concentration measuring device 482 of FIGS. 8 and 9, the gas concentration measuring device 484 of FIG. 9, the gas concentration measuring device 580 of FIG. 10, or a combination thereof. When the oxygen concentration measured in process P280 exceeds a reference range, a purging process similar to that in process P278 may be further performed before a subsequent process P282 is performed. As a result, the oxygen concentration within the reaction space on the substrate or the oxygen concentration within the vent pipe connected to the reaction space may be controlled to be within the reference range, for example, a range of less than about 10 vol %.

In process P282 of FIG. 11, according to the same method as that described above with reference to process P260 of FIG. 7, a reductive reaction gas is supplied onto the substrate to perform a reduction process on the metal oxide layer formed in process P276, thereby decreasing an oxygen content of the metal oxide layer. As a result, a metal layer, or a metal oxide layer having a smaller oxygen content than the metal oxide layer formed in process P276, may be obtained.

According to exemplary embodiments, the metal layer or the metal oxide layer obtained in process P282 may include, for example, Mo, $MoO_2$, or a combination thereof. According to exemplary embodiments, the metal layer or the metal oxide layer obtained in process P282 may include, for example, Nb, NbO, $NbO_2$, or a combination thereof. According to exemplary embodiments, the metal layer or the metal oxide layer obtained in process P282 may include, for example, Sn, SnO, or a combination thereof.

In process P284 of FIG. 11, according to a similar method to that of process P278 described above with reference to FIG. 11, a purge gas is supplied onto the substrate to thereby remove unnecessary by-products on the substrate.

In process P286 of FIG. 1, a hydrogen concentration within the reaction space on the substrate, or a hydrogen concentration within the vent pipe connected to the reaction space, is measured.

In process P286, the hydrogen concentration may be measured using the gas concentration measuring device 482 of FIGS. 8 and 9, the gas concentration measuring device 484 of FIG. 9, the gas concentration measuring device 580 of FIG. 10, or a combination thereof. When the hydrogen concentration measured in process P286 exceeds a reference range, a purging process similar to that in process P284 may be further performed before a subsequent process P288 is performed. As a result, the hydrogen concentration within the reaction space on the substrate or the hydrogen concentration within the vent pipe connected to the reaction space may be controlled to be within a reference range, for example, a range of less than about 4 vol %.

In process P288 of FIG. 11, it is determined whether a target thickness of the interface layer has been obtained, and a deposition cycle of processes P272 through P286 may be repeated several times until the target thickness of the interface layer is obtained. When it is determined in process P288 that the target thickness of the interface layer has been obtained, the processes described above with reference to FIG. 11 may be concluded.

An interface layer manufactured according to an IC device manufacturing method according to the inventive concept may be used for various purposes. For example, the interface layer may be used in capacitors, three-dimensional charge trap flash (3D CTF) cells, transistors, metal wiring, liquid crystal displays, solar batteries, nanostructures, and the like. However, applications of the interface layer are not limited thereto.

FIGS. 12A through 12J are cross-sectional views illustrating a method of manufacturing an IC device 600 (see FIG. 12J) according to exemplary embodiments of the inventive concept.

Figure 12A:
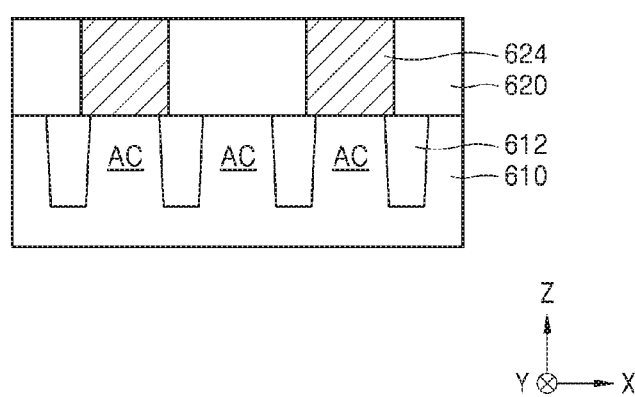
FIGS. 12A through 12J are cross-sectional views illustrating a method of manufacturing an IC device according to exemplary embodiments of the inventive concept.

Referring to FIG. 12A, an interlayer insulating layer 620 is formed on a substrate 610 including a plurality of active regions AC. Thereafter, a plurality of conductive regions 624 are formed through the interlayer insulating layer 620 and connected to the plurality of active regions AC.

The substrate 610 has substantially the same configuration as the substrate 110 of FIG. 1. The plurality of active regions AC may be defined by a plurality of device isolation regions 612. The interlayer insulating layer 620 may include, for example, a silicon oxide layer. The plurality of conductive regions 624 may include, for example, polysilicon, metal, conductive metal nitride, metal silicide, or a combination thereof.

Figure 12B:
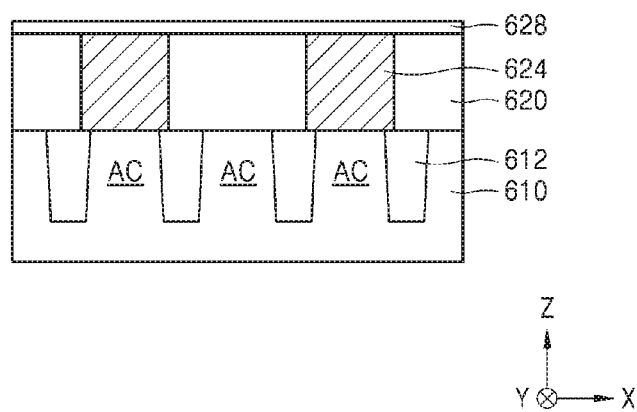

Referring to FIG. 12B, an insulating layer 628 is formed and covers the interlayer insulating layer 620 and the plurality of conductive regions 624.

The insulating layer 628 may be used as an etch stop layer. The insulating layer 628 may include an insulating material having etch selectivity with respect to the interlayer insulating layer 620 and a mold layer 630 (refer to FIG. 12C) formed during a subsequent process. In exemplary embodiments, the insulating layer 628 may include, for example, silicon nitride, silicon oxynitride, or a combination thereof.

Figure 12C:
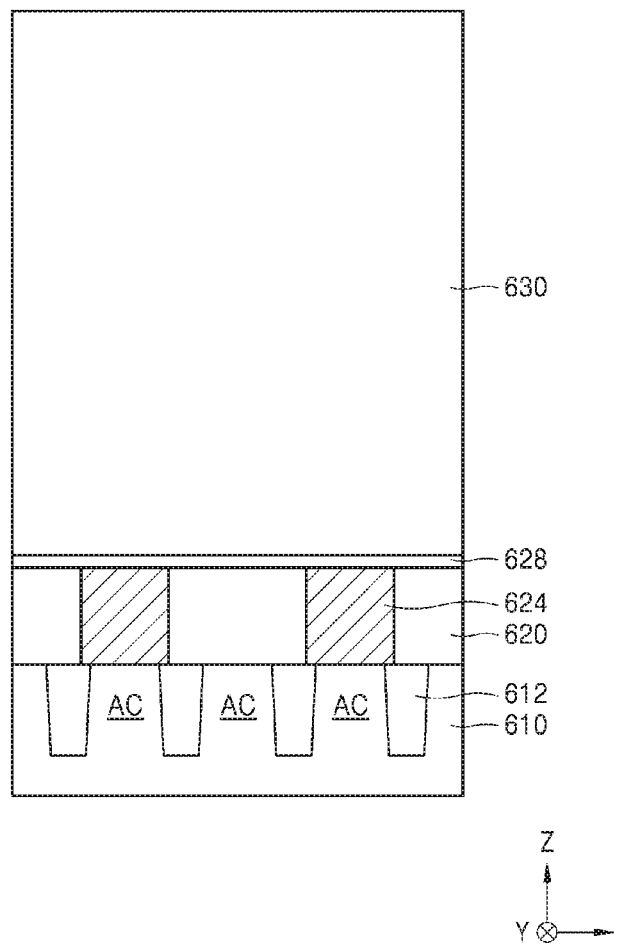

Referring to FIG. 12C, the mold layer 630 is formed on the insulating layer 628. The mold layer 630 may include an oxide layer. In exemplary embodiments, the mold layer 630 may include a support layer. The support layer may include a material having etch selectivity with respect to the mold layer 630.

Figure 12D:
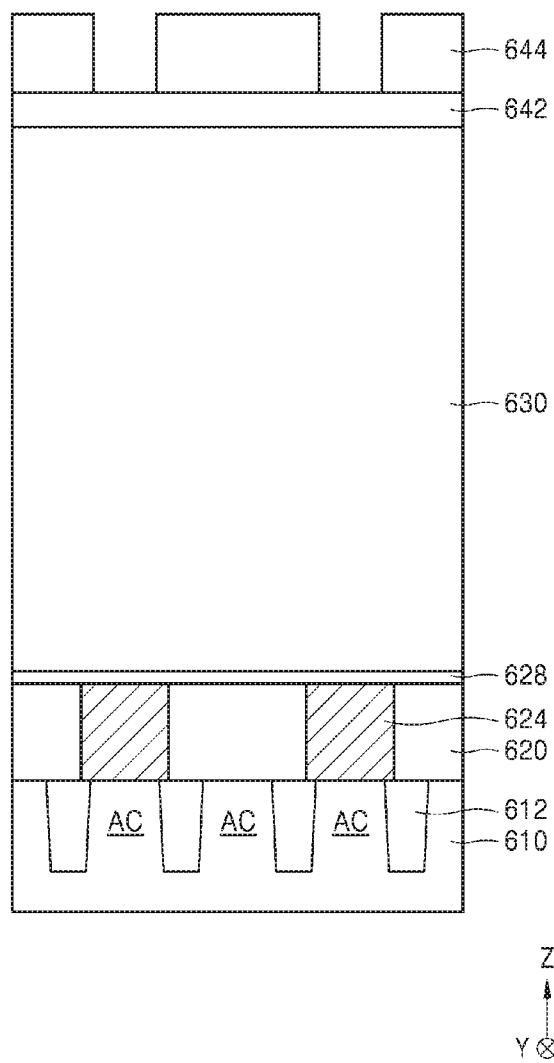

Referring to FIG. 12D, a sacrificial layer 642 and a mask pattern 644 are sequentially formed on the mold layer 630.

The sacrificial layer 642 may include an oxide layer. The sacrificial layer 642 may protect the support layer included in the mold layer 630. The mask pattern 644 may include, for example, an oxide layer, a nitride layer, a poly-Si layer, a photoresist layer, or a combination thereof. A region at which a lower electrode of a capacitor will be formed may be defined by the mask pattern 644.

Figure 12E:
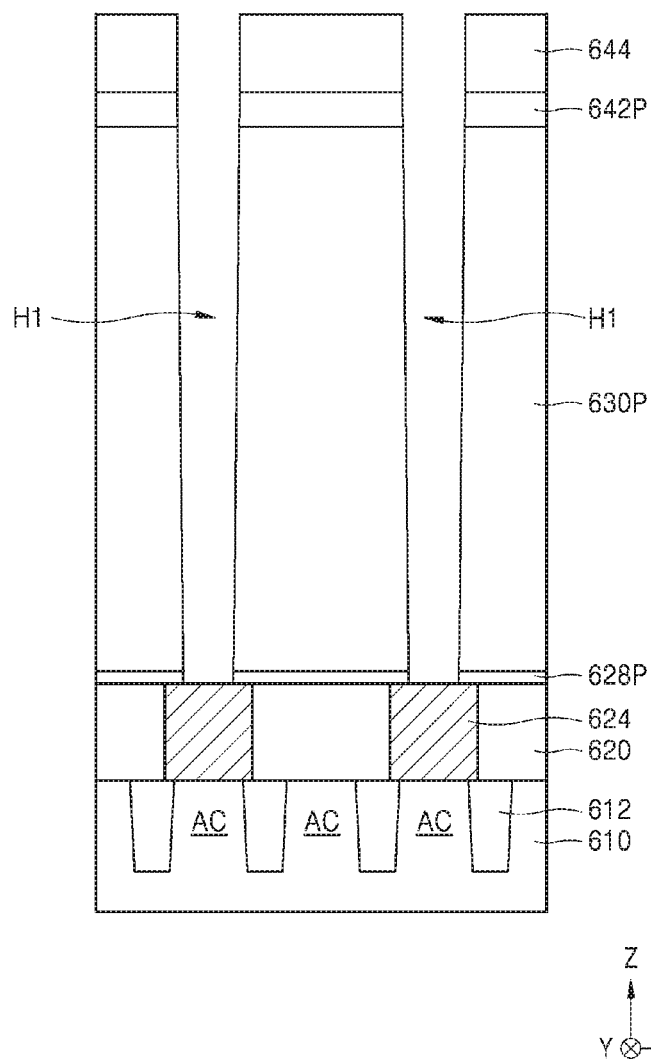

Referring to FIG. 12E, the sacrificial layer 642 and the mold layer 630 are dry etched by using the mask pattern 644 as an etch mask and using the insulating layer 628 as an etch stop layer, thereby forming a sacrificial pattern 642P and a mold pattern 630P that define a plurality of holes $H_1$. At this time, the insulating layer 628 may also be etched due to excessive etching, thereby forming an insulating pattern 628P and exposing the plurality of conductive regions 624.

Figure 12F:
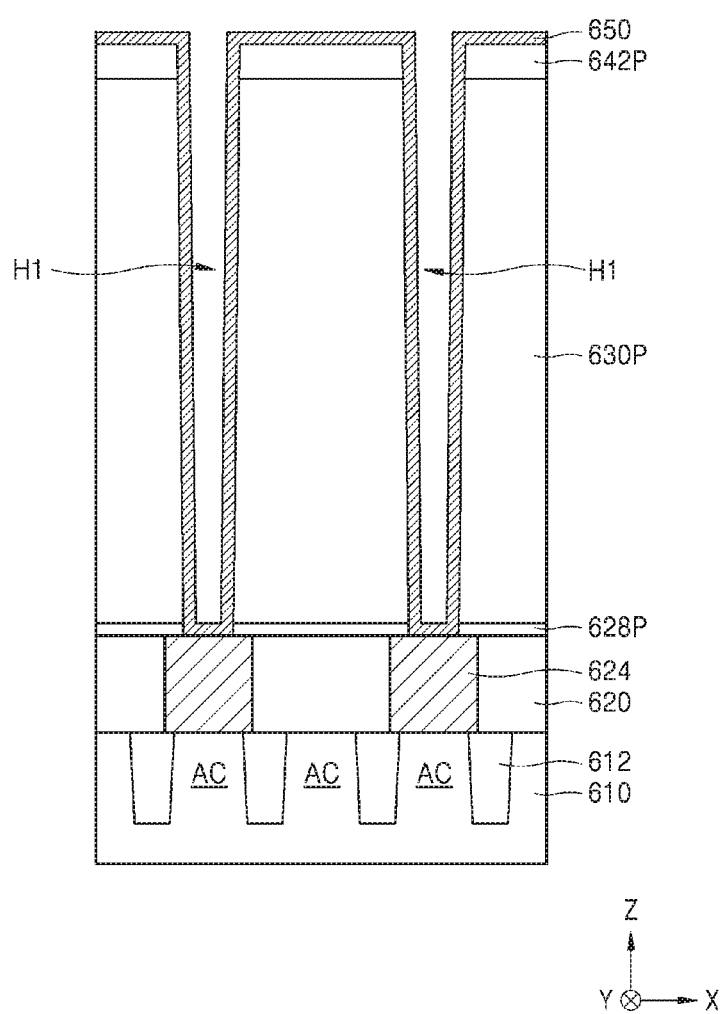

Referring to FIG. 12F, after the mask pattern 644 is removed from the resultant structure of FIG. 12E, a lower electrode-formation conductive layer 650 may be formed. The lower electrode-formation conductive layer 650 may cover respective surfaces of the plurality of conductive regions 624, a surface of the insulating pattern 628P, a surface of the mold pattern 630P, and a surface of the sacrificial pattern 642P within the plurality of holes $H_1$.

The lower electrode-formation conductive layer 650 may be conformally formed on respective inner sidewalls of the plurality of holes $H_1$ such that respective inner spaces of the plurality of holes $H_1$ partially remain.

A material used to form the lower electrode-formation conductive layer 650 is the same as a material used to form the lower electrode 130 described above with reference to FIG. 1. The lower electrode-formation conductive layer 650 may be formed using, for example, a CVD process, a metal organic CVD (MOCVD) process, or an ALD process.

Figure 12G:
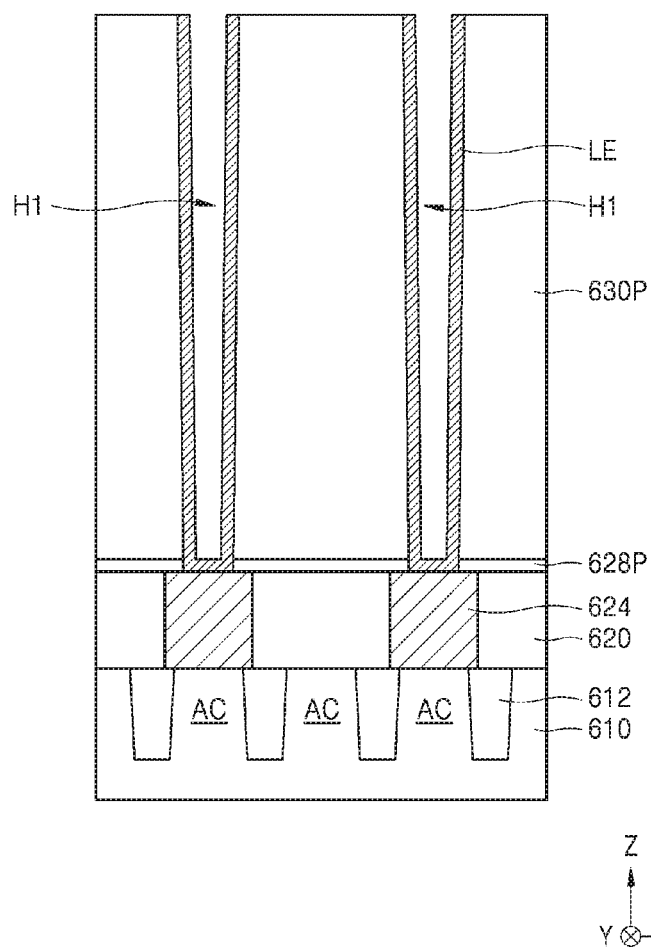

Referring to FIG. 12G, an upper portion of the lower electrode-formation conductive layer 650 is partially removed from the resultant structure of FIG. 12F. As a result, the lower electrode-formation conductive layer 650 may be separated into a plurality of lower electrodes LE.

To form the plurality of lower electrodes LE, the upper portion of the lower electrode-formation conductive layer 650 and the sacrificial pattern 642P (refer to FIG. 12F) may be removed using, for example, an etchback process or a chemical mechanical polishing (CMP) process. As a result, a top surface of the mold pattern 630P is exposed.

Figure 12H:
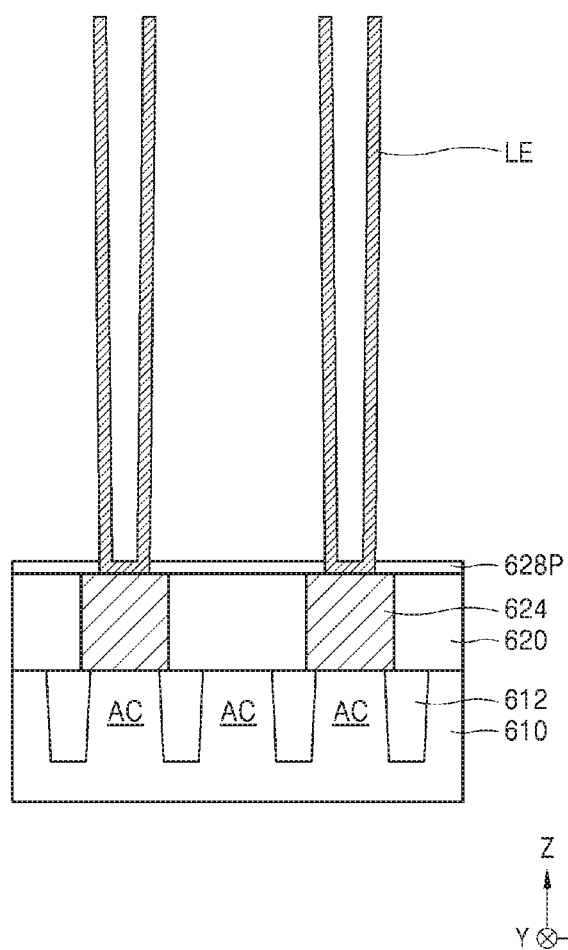

Referring to FIG. 12H, the mold pattern 630P may be removed from the resultant structure of FIG. 12G. As a result, outer surfaces of the plurality of lower electrodes LE having cylindrical shapes are exposed.

Figure 12I:
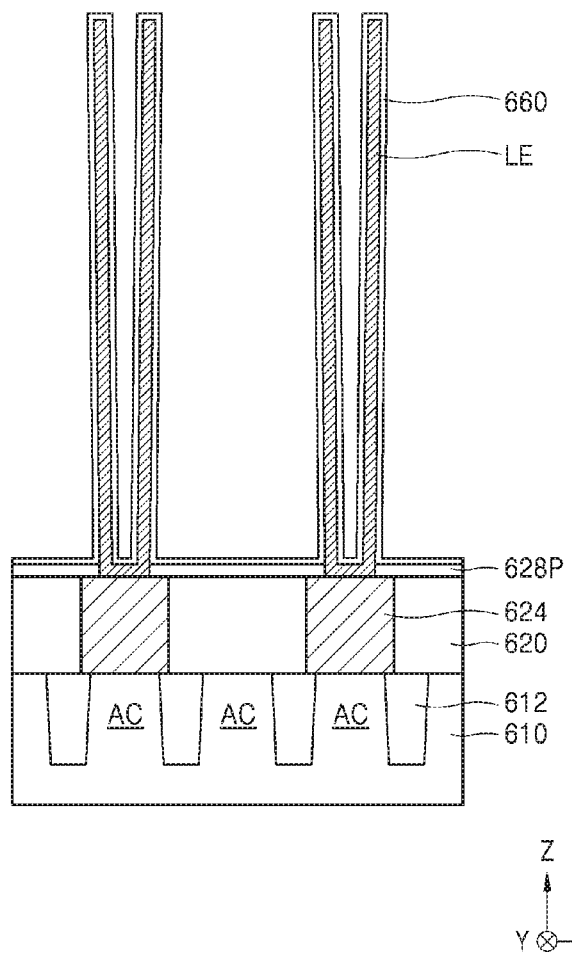

Referring to FIG. 12I, a dielectric layer structure 660 is formed on the plurality of lower electrodes LE.

According to exemplary embodiments, the dielectric layer structure 660 may have the stack structure including the lower interface layer 160, the dielectric layer 150, and the upper interface layer 170 described above with reference to FIG. 1. According to exemplary embodiments, the dielectric layer structure 660 may have the stack structure including the dielectric layer 150 and the upper interface layer 170 described above with reference to FIG. 2. According to exemplary embodiments, the dielectric layer structure 660 may have the stack structure including the lower interface layer 160 and the dielectric layer 150 described above with reference to FIG. 3.

The dielectric layer structure 660 may be formed such that it conformally covers exposed surfaces of the plurality of lower electrodes LE. The dielectric layer structure 660 may be formed using an ALD process.

The dielectric layer structure 660 may be formed, for example, by at least one of the methods described with reference to FIGS. 4, 5A, 5B, 6, 7, and 11. The dielectric layer structure 660 may be formed, for example, by one of the IC device manufacturing apparatuses 400A, 400B, and 400C of FIGS. 8 through 10.

According to exemplary embodiments, the resultant structure in which the dielectric layer structure 660 has been formed may be annealed at a temperature of about 500° C. to about 1,150° C.

Figure 12J:
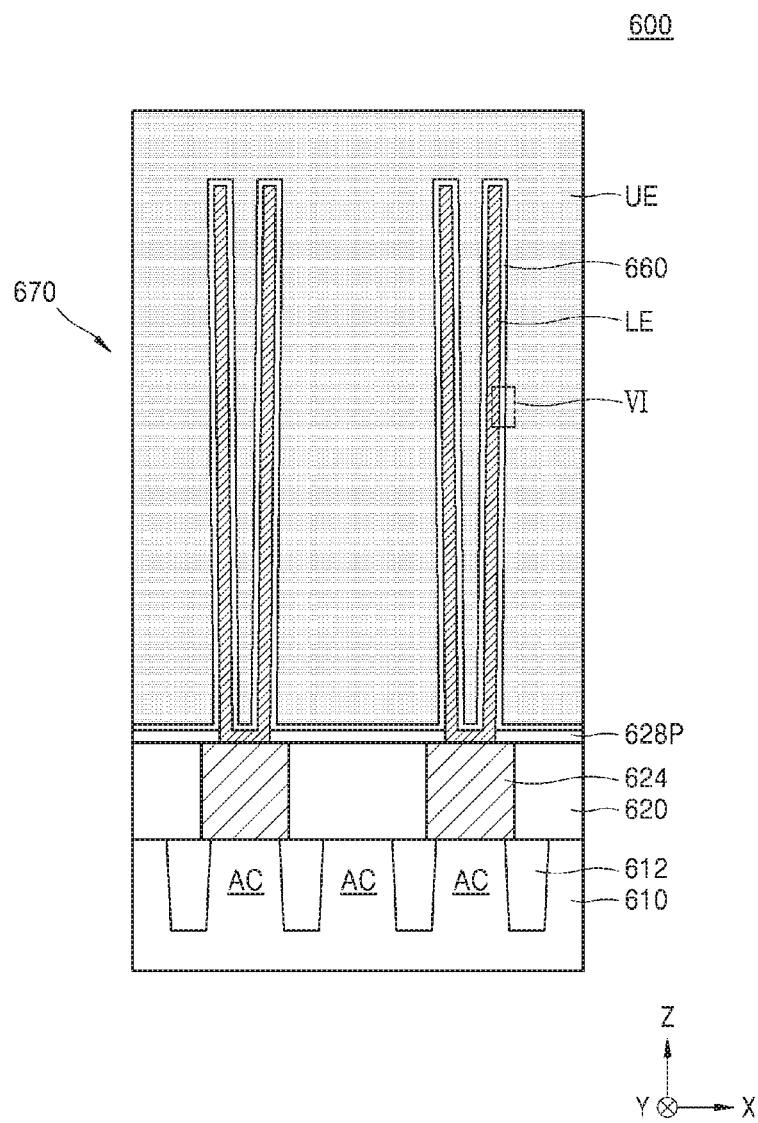

Referring to FIG. 12J, an upper electrode UE is formed on the dielectric layer structure 660. A capacitor 670 may be configured by the lower electrodes LE, the dielectric layer structure 660, and the upper electrode UE.

A material used to form the upper electrode UE is the same as a material used to form the upper electrode 140 described above with reference to FIG. 1. The upper electrode UE may be formed using, for example, a CVD process, an MOCVD process, a physical vapor deposition (PVD) process, or an ALD process.

Figure 13A:
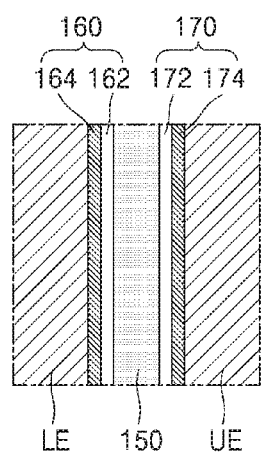
FIGS. 13A through 13C are magnified cross-sectional views of region VI in FIG. 12J, illustrating various examples of a dielectric layer structure of an IC device according to exemplary embodiments of the inventive concept.
Figure 13B:
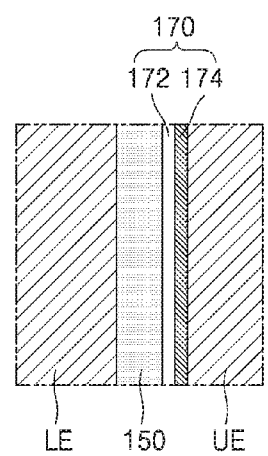
Figure 13C:
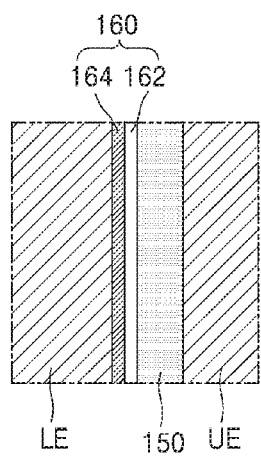

FIGS. 13A through 13C are cross-sectional views illustrating various examples of the dielectric layer structure 660 of the IC device 600 of FIG. 12J, and are magnified cross-sectional views of a portion indicated by a reference character "VI" of FIG. 12J.

Referring to FIGS. 13A through 13C, the dielectric layer structure 660 of the IC device 600 may have a stack structure including the lower interface layer 160, the dielectric layer 150, and the upper interface layer 170. According to exemplary embodiments, the dielectric layer structure 660 may have a stack structure including the dielectric layer 150 and the upper interface layer 170. According to exemplary embodiments, the dielectric layer structure 660 may have a stack structure including the lower interface layer 160 and the dielectric layer 150.

Detailed structures of the lower interface layer 160, the dielectric layer 150, and the upper interface layer 170 of FIGS. 13A through 13C are the same as those described above with reference to FIGS. 1 through 3.

In the method of manufacturing the IC device 600 described above with reference to FIGS. 12A through 12J, pillar-shaped lower electrodes having no internal spaces, or planar lower electrodes, may be formed instead of the lower electrodes LE having cylindrical shapes, and the dielectric layer structure 660 may be formed such that it conformally covers the pillar-shaped lower electrodes or the planar lower electrodes.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. An integrated circuit device, comprising:
a substrate;
an electrode disposed on the substrate;
a dielectric layer disposed on the electrode,
wherein the electrode is disposed between the substrate and the dielectric layer; and
a plurality of interface layers interposed between the electrode and the dielectric layer and comprising a first metal,
wherein the plurality of interface layers comprises a first interface layer and a second interface layer disposed between the electrode and the dielectric layer, an oxygen content of the first interface layer is different from an oxygen content of the second interface layer, and each of the first interface layer and the second interface layer includes oxygen.

2. The integrated circuit device of claim 1, wherein each of the first interface layer and the second interface layer comprises an oxide of the first metal,
the first interface layer is disposed closer to the dielectric layer than the second interface layer, and
the oxygen content of the first interface layer is greater than the oxygen content of the second interface layer.

3. The integrated circuit device of claim 1, wherein the second interface layer is spaced apart from the dielectric layer,
the first interface layer is interposed between the second interface layer and the dielectric layer, and
the oxygen content of the second interface layer is less than the oxygen content of the first interface layer.

4. The integrated circuit device of claim 1, wherein the first interface layer is in contact with the dielectric layer and comprises an oxide of the first metal, and
the second interface layer is in contact with the electrode and comprises the first metal.

5. The integrated circuit device of claim 1, wherein the electrode comprises the first metal, a nitride of the first metal, an oxide of the first metal, or a combination of the first metal, the nitride of the first metal, and the oxide of the first metal.

6. The integrated circuit device of claim 1, wherein the electrode comprises a nitride of a second metal that is different from the first metal.

7. The integrated circuit device of claim 1, wherein the dielectric layer comprises a second metal that is different from the first metal, and
an electronegativity of the first metal is greater than an electronegativity of the second metal.

8. The integrated circuit device of claim 1, wherein the first metal is selected from Mo, Nb, Sn, Ta, Ti, In, Ni, Co, W, and Ru.

9. The integrated circuit device of claim 1, wherein the first interface layer and the second interface layer comprise different materials from each other and are selected from Mo, $MoO_2$, and $MoO_3$, respectively.

10. The integrated circuit device of claim 1, wherein the first interface layer and the second interface layer comprise different materials from each other and are selected from Nb, NbO, $NbO_2$, and $Nb_2O_5$, respectively.

11. An integrated circuit device, comprising:
a lower electrode and an upper electrode facing each other;
a dielectric layer interposed between the lower electrode and the upper electrode;

a lower interface layer interposed between the lower electrode and the dielectric layer and comprising a first metal; and an upper interface layer interposed between the dielectric layer and the upper electrode and comprising the first metal, wherein the lower interface layer comprises a first inner interface layer that is in contact with the dielectric layer and has a first oxygen content, and a first outer interface layer disposed between the first inner interface layer and the lower electrode and having a second oxygen content that is lower than the first oxygen content, wherein the upper interface layer comprises a second inner interface layer that is in contact with the dielectric layer and has a third oxygen content, and a second outer interface layer disposed between the second inner interface layer and the upper electrode and having a fourth oxygen content that is lower than the third oxygen content, wherein each of the first inner interface layer, the first outer interface layer, the second inner interface layer, and the second outer interface layer includes oxygen.

12. The integrated circuit device of claim 11, wherein each of the first and second outer interface layers comprises a conductive layer.

13. The integrated circuit device of claim 11, wherein each of the first and second inner interface layers is in contact with the dielectric layer and comprises an oxide $M_xO_y$ of the first metal, wherein M is the first metal, x is equal to 1 or 2, y is an integer, and $1 \leq y \leq 5$, and each of the first and second outer interface layers comprises an oxide $M_qO_r$ of the first metal, wherein M is the first metal, q is equal to 1, and r is equal to 1 or 2.

14. The integrated circuit device of claim 11, wherein the dielectric layer comprises a second metal that is different from the first metal, and an electronegativity of the first metal is greater than an electronegativity of the second metal.

15. The integrated circuit device of claim 11, wherein at least one of the lower electrode and the upper electrode comprises the first metal, a nitride of the first metal, an oxide of the first metal, or a combination of the first metal, the nitride of the first metal, and the oxide of the first metal.

16. The integrated circuit device of claim 11, wherein each of the first and second inner interface layers comprises $MoO_2$, $MoO_3$, or a combination of $MoO_2$ and $MoO_3$, and each of the first and second outer interface layers comprises Mo, $MoO_2$, or a combination of Mo and $MoO_2$.

17. The integrated circuit device of claim 11, wherein each of the first and second inner interface layers comprises NbO, $NbO_2$, $Nb_2O_5$, or a combination of NbO, $NbO_2$ and $Nb_2O_5$, and each of the first and second outer interface layers comprises Nb, NbO, $NbO_2$, or a combination of Nb, NbO and $NbO_2$.

18. An integrated circuit device, comprising:

a lower electrode and an upper electrode facing each other;

a dielectric layer interposed between the lower electrode and the upper electrode;

a lower interface layer interposed between the lower electrode and the dielectric layer and comprising a first metal; and an upper interface layer interposed between the dielectric layer and the upper electrode and comprising the first metal, wherein the lower interface layer comprises a first inner interface layer that is in contact with the dielectric layer and has a first oxygen content, and a first outer interface layer disposed between the first inner interface layer and the lower electrode and having a second oxygen content that is lower than the first oxygen content, wherein the upper interface layer comprises a second inner interface layer that is in contact with the dielectric layer and has a third oxygen content, and a second outer interface layer disposed between the second inner interface layer and the upper electrode and having a fourth oxygen content that is lower than the third oxygen content, wherein at least one of the lower electrode and the upper electrode comprises the first metal, an oxide of the first metal, or a combination of the first metal and the oxide of the first metal, wherein each of the first inner interface layer, the first outer interface layer, the second inner interface layer, and the second outer interface layer includes oxygen.

19. The integrated circuit device of claim 18, wherein the first metal is selected from Mo, Nb, Sn, W, and Ru, and at least one of the lower electrode and the upper electrode comprises a conductive layer including Mo, Nb, Sn, SnO, W, Ru, or a combination thereof.

20. The integrated circuit device of claim 18, wherein the dielectric layer comprises a second metal that is different from the first metal.

* * * * *